US012677570B2

(12) United States Patent
Oh et al.

(10) Patent No.: US 12,677,570 B2
(45) Date of Patent: Jul. 7, 2026

(54) ELECTRONIC DEVICE INCLUDING METAL PATTERNS IN MARGIN AREA

(71) Applicant: Samsung Display Co., Ltd., Yongin-si (KR)

(72) Inventors: Eon Seok Oh, Yongin-si (KR);
Taehyun Sung, Yongin-si (KR);
Sangyeol Kim, Yongin-si (KR);
Je-Hyun Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 484 days.

(21) Appl. No.: 18/309,608

(22) Filed: Apr. 28, 2023

(65) Prior Publication Data

US 2023/0389401 A1     Nov. 30, 2023

(30) Foreign Application Priority Data

May 27, 2022    (KR) ........................ 10-2022-0065589

(51) Int. Cl.
*H10K 59/80*        (2023.01)
*H10K 59/12*        (2023.01)
(Continued)

(52) U.S. Cl.
CPC ....... *H10K 59/873* (2023.02); *H10K 59/1201* (2023.02); *H10K 59/40* (2023.02); *H10K 59/65* (2023.02); *H10K 59/70* (2023.02)

(58) Field of Classification Search
CPC .... H10K 50/11; H10K 50/822; H10K 50/844; H10K 59/873; H10K 59/40; H10K 59/65; H10K 59/70; H10K 59/80521; H10K 59/121; H10K 59/124; H10K 59/12; H10K 59/1213; H10K 59/123; H10K 59/126; H10K 59/131; H10K 59/60; H10K 86/451
See application file for complete search history.

(56) References Cited

U.S. PATENT DOCUMENTS 10,319,938 B2    6/2019   Choi et al.
10,861,920 B2    12/2020  Jeong et al.
(Continued)

FOREIGN PATENT DOCUMENTS

CN          110957433 A  *  4/2020  ............. H10K 71/00
CN          114141964 A  *  3/2022  ......... H10K 59/8731
(Continued)

*Primary Examiner* — Ida M Soward
(74) *Attorney, Agent, or Firm* — Womble Bond Dickinson (US) LLP

(57) ABSTRACT
An electronic device includes a display panel including a base layer, a circuit element layer including a buffer layer, a transistor, at least one insulating layer on the buffer layer, and a first metal pattern on the at least one insulating layer and overlapping the margin area, a display element layer including an organic layer between a first electrode and a second electrode, and a light emitting device overlapping a pixel area, wherein an electrode opening corresponding to the margin area is defined in the second electrode, and an encapsulation layer on the display element layer. An insulation opening is defined to be overlapped between an edge of the second electrode defined an electrode opening and the first metal pattern in the at least one insulating layer, and exposes a portion of the buffer layer.

20 Claims, 19 Drawing Sheets

(51) Int. Cl.
    *H10K 59/40*       (2023.01)
    *H10K 59/65*       (2023.01)
    *H10K 59/70*       (2023.01)

(56)            References Cited

U.S. PATENT DOCUMENTS

| | | | |
|---|---|---|---|
| 11,594,559 B2 | 2/2023 | Park et al. | |
| 11,871,599 B2 | 1/2024 | Sung et al. | |
| 2020/0052054 A1* | 2/2020 | Park | H10K 59/1213 |
| 2020/0127231 A1* | 4/2020 | Yun | H10K 59/124 |
| 2020/0273927 A1* | 8/2020 | Oh | H10K 59/121 |
| 2020/0286948 A1* | 9/2020 | Qin | G02F 1/1333 |
| 2020/0321561 A1* | 10/2020 | Park | H10K 59/65 |
| 2020/0395419 A1* | 12/2020 | Kim | H10D 86/443 |
| 2020/0403047 A1 | 12/2020 | Oh et al. | |
| 2021/0066419 A1 | 3/2021 | Byun et al. | |
| 2021/0091157 A1 | 3/2021 | Oh et al. | |
| 2021/0151531 A1* | 5/2021 | Jo | H10K 59/122 |
| 2021/0328184 A1 | 10/2021 | Jung et al. | |
| 2022/0102678 A1* | 3/2022 | Kim | H10K 59/121 |
| 2024/0057440 A1* | 2/2024 | Huh | H10H 29/142 |

FOREIGN PATENT DOCUMENTS

| | | | | |
|---|---|---|---|---|
| KR | 10-2018-0009845 A | | 1/2018 | |
| KR | 10-2019-0132603 A | | 11/2019 | |
| KR | 10-2020-0144627 A | | 12/2020 | |
| KR | 20200145954 A | * | 12/2020 | H10K 59/131 |
| KR | 10-2021-0028790 A | | 3/2021 | |
| KR | 10-2021-0129788 A | | 10/2021 | |
| KR | 10-2021-0130329 A | | 11/2021 | |
| KR | 10-2022-0056924 A | | 5/2022 | |
| KR | 10-2022-0060013 A | | 5/2022 | |

* cited by examiner

ELECTRONIC DEVICE INCLUDING METAL PATTERNS IN MARGIN AREA

CROSS-REFERENCE TO RELATED APPLICATIONS

The present application claims priority to and the benefit of Korean Patent Application No. 10-2022-0065589, filed on May 27, 2022, in the Korean Intellectual Property Office, the entire content of which are hereby incorporated by reference.

BACKGROUND

Aspects of some embodiments of the inventive concept relate to an electronic device having improved reliability.

An electronic device may be activated in response to an electrical signal. The electronic device may include various electronic components, such as a display unit displaying images or a sensing unit sensing external inputs. The electronic components may be electrically connected to each other by variously arranged signal lines.

The above information disclosed in this Background section is only for enhancement of understanding of the background and therefore the information discussed in this Background section does not necessarily constitute prior art.

SUMMARY

Aspects of some embodiments of the inventive concept include an electronic device with relatively improved reliability.

An electronic device according to some embodiments of the inventive concept includes a display panel including a pixel area providing an image, a margin area surrounded by the pixel area, and a hole area surrounded by the margin area, the display panel includes a base layer, a circuit element layer including a buffer layer on the base layer, at least one transistor on the buffer layer, at least one insulating layer on the buffer layer, and a first metal pattern on the at least one insulating layer and overlapping the margin area, a display element layer including a first electrode connected to the at least one transistor, a second electrode, and an organic layer between the first electrode and the second electrode, wherein an electrode opening corresponding to the margin area is defined in the second electrode, and an encapsulation layer on the display element layer, a hole passing through the display panel is defined in the hole area, and an insulation opening is defined to be overlapped between an edge of the second electrode defined the electrode opening and the first metal pattern in the at least one insulating layer, and exposes a portion of the buffer layer.

According to some embodiments, the organic layer may cover the portion of the buffer layer exposed by the insulation opening, and the second electrode may overlap only the pixel area and may be spaced apart from the insulation opening.

According to some embodiments, the circuit element layer may further include a first dam part on the at least one insulating layer and overlapped between the first metal pattern and the hole, and a first organic opening exposing the first metal pattern may be defined in the organic layer, and the organic layer covers the first dam part.

According to some embodiments, the encapsulation layer may include a first inorganic layer, a thin organic layer on the first inorganic layer and having a boundary defined by the first dam part, and a second inorganic layer on the thin organic layer, and the first inorganic layer may cover the first metal pattern.

According to some embodiments, the first inorganic layer and the second inorganic layer may be in contact with each other from a top surface of the first dam part to the hole area.

According to some embodiments, the circuit element layer may further include a second dam part overlapping the margin area and adjacent to the hole than the first dam part, and a second metal pattern between the first dam part and the second dam part, and a second organic opening exposing the second metal pattern may be defined in the organic layer, and the organic layer may cover the second dam part.

According to some embodiments, the circuit element layer may further include a third dam part overlapping the margin area and adjacent to the hole than the second dam part, and a third metal pattern between the second dam part and the third dam part, and a third organic opening exposing the third metal pattern may be defined in the organic layer, and the organic layer may cover the third dam part.

According to some embodiments, a thickness of the third dam part may be smaller than a thickness of the first dam part and a thickness of the second dam part.

According to some embodiments, the at least one transistor may include a first transistor including a first active pattern, a first control electrode overlapping the first active pattern, and an upper electrode overlapping the first control electrode, and a second transistor including a second active pattern and a second control electrode overlapping the second active pattern.

According to some embodiments, the circuit element layer may include a first insulating layer on the buffer layer and covering the first active pattern, a second insulating layer on the first insulating layer and covering the first control electrode, a third insulating layer on second insulating layer and covering the upper electrode, a fourth insulating layer on the third insulating layer and covering the second active pattern, a fifth insulating layer on the fourth insulating layer and covering the second control electrode, a sixth insulating layer on the fifth insulating layer, and a seventh insulating layer on the sixth insulating layer, and the at least one insulating layer may include at least one of the first to the fifth insulating layers.

According to some embodiments, the first insulating layer and the fourth insulating layer may include a single layer of silicon oxide, the second insulating layer may include a single layer of silicon nitride, and the third insulating layer and the fifth insulating layer may include sequentially stacked silicon nitride and silicon oxide.

According to some embodiments, the first to fifth insulating layers may be in contact with each other in the margin area except for the insulation opening.

According to some embodiments, the circuit element layer may further include a first connection electrode on the fifth insulating layer and connected to the first active pattern through a first contact hole defined in the first to fifth insulating layers, and a second connection electrode on the sixth insulating layer and connected to the first connection electrode through a contact hole defined in the sixth insulating layer, and each of the first connection electrode and the second connection electrode may include a lower layer, a middle layer, and an upper layer sequentially stacked.

According to some embodiments, the first metal pattern may include the same material as a material of the lower layer of the first connection electrode.

According to some embodiments, the lower layer and the upper layer may include titanium, and the middle layer may include aluminum.

According to some embodiments, the electronic device may further include a planarization layer on the encapsulation layer and surrounding the hole area.

According to some embodiments, the electronic device may further include an input sensor on the encapsulation layer and the planarization layer, and spaced apart from the hole area.

According to some embodiments, the base layer may include a first base layer including an organic material, a cover layer on the first base layer and including an inorganic material, and a second base layer on the cover layer and including an organic material, and the circuit element layer may further include a barrier layer between the second base layer and the buffer layer.

According to some embodiments, the circuit element layer may further include a light blocking pattern on the barrier layer, covered by the buffer layer, and overlapping the at least one transistor.

According to some embodiments, the electronic device may further include an electronic module overlapping the hole, and the electronic module may include at least one of a light emitting module, a light receiving module, or a camera module.

BRIEF DESCRIPTION OF THE DRAWINGS

Aspects of some embodiments will be more clearly understood from the following brief description taken in conjunction with the accompanying drawings. The accompanying drawings represent non-limiting, example embodiments as described herein.

FIGS. 6A to 6L are cross-sectional views illustrating a method of manufacturing a display module according to some embodiments of the inventive concept.

DETAILED DESCRIPTION

Figure 1:
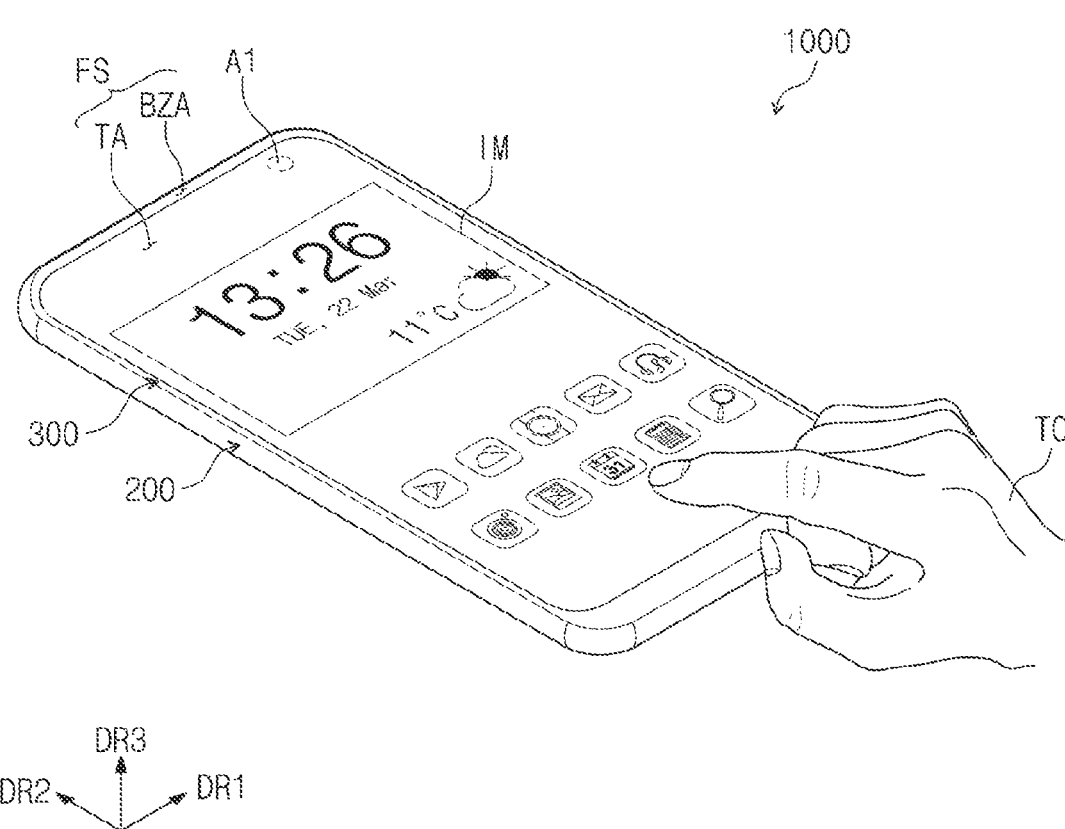
FIG. 1 is a perspective view of an electronic device according to some embodiments of the inventive concept.

When a component (or an area, a layer, a part, etc.) is referred to as being "on," "connected to," or "coupled to" another element, it may be directly on, connected to, or coupled to the other component or intervening components may be present.

Like reference numerals denote like elements. Additionally, in the drawings, thicknesses, proportions, and dimensions of components are exaggerated for effective description of technical content. The term "and/or" includes any and all combinations of one or more of the associated listed items.

It will be understood that, although the terms "first", "second", etc. may be used herein to describe various components, these components should not be limited by these terms. These terms are only used to distinguish one component from another component. For example, a first component discussed below could be termed a second component without departing from the teachings of embodiments. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "include" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, aspects of some embodiments of the inventive concept will be described in more detail with reference to the drawings.

Figure 2A:
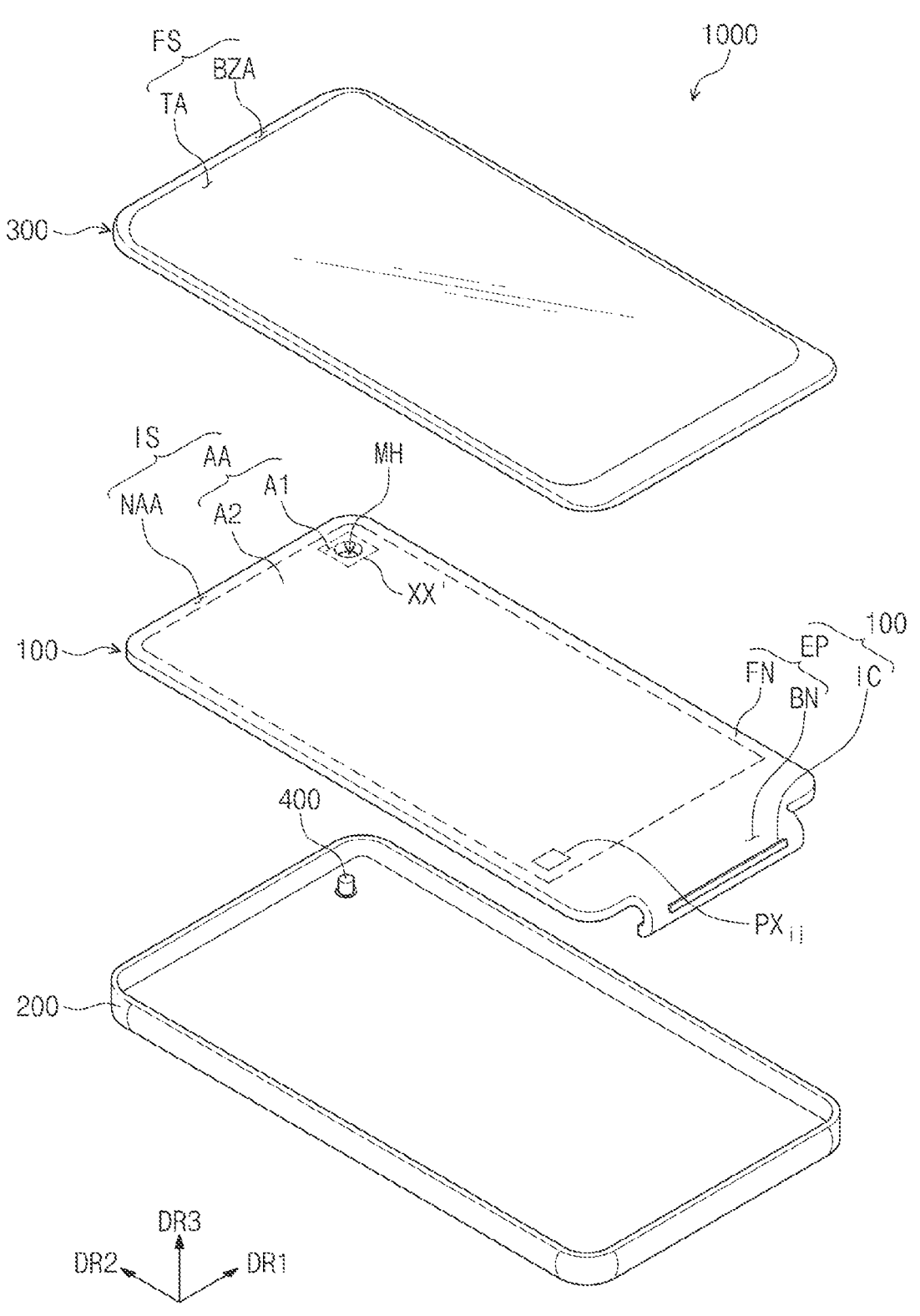
FIG. 2A is an exploded perspective view of an electronic device according to some embodiments of the inventive concept.
Figure 2B:
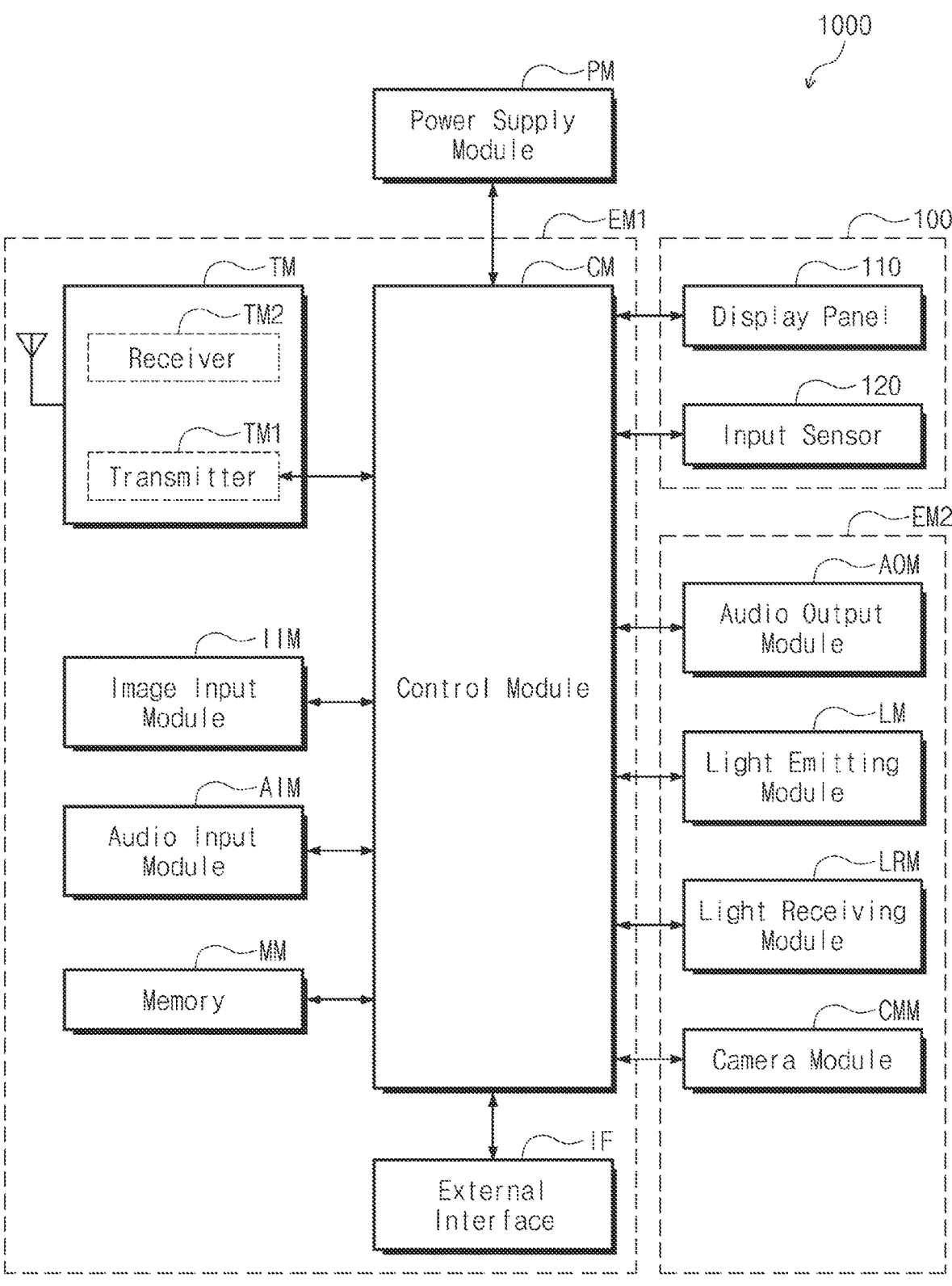
FIG. 2B is a block diagram of an electronic device according to some embodiments of the inventive concept.
Figure 3:
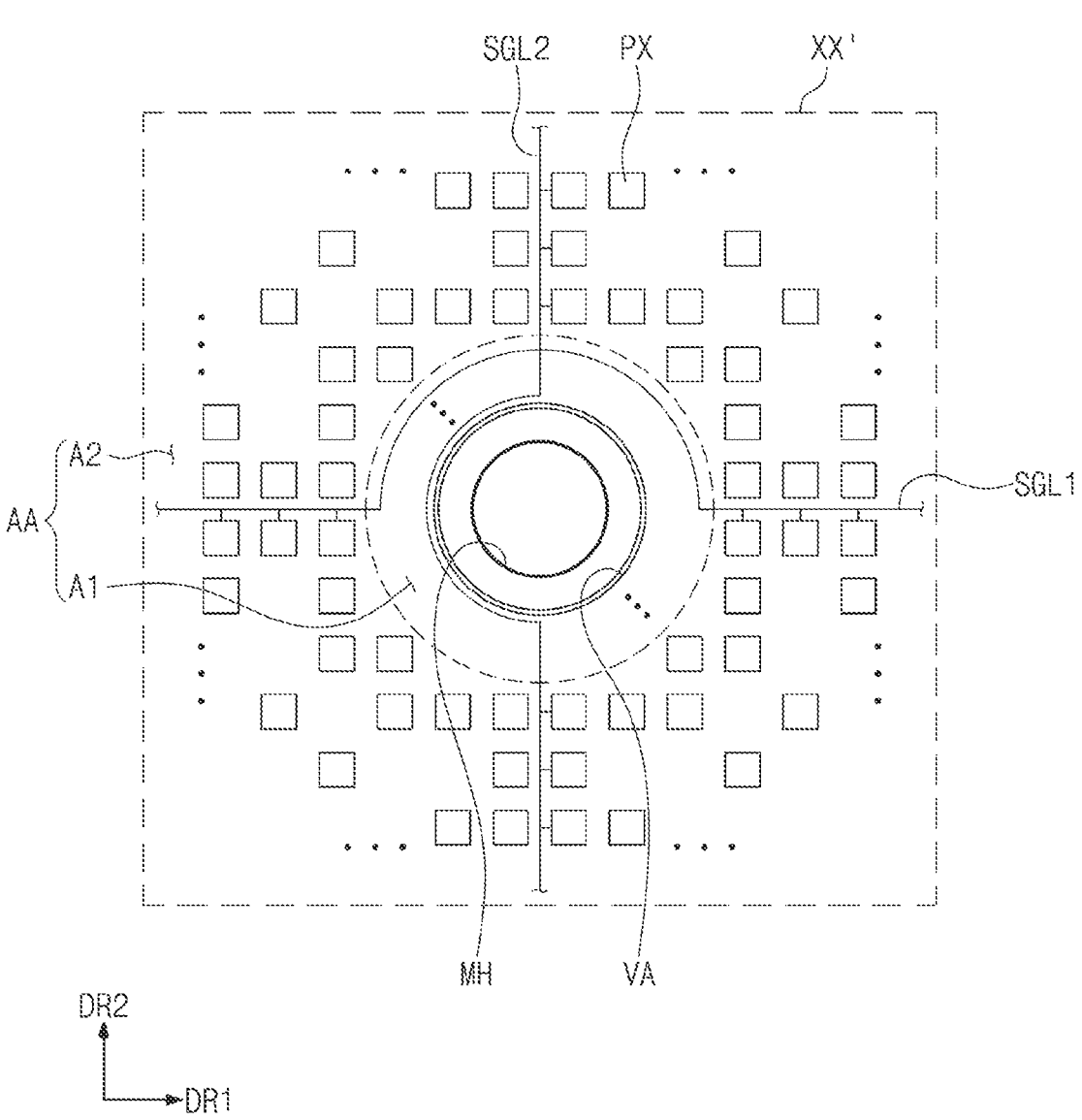
FIG. 3 is a plan view of a display panel adjacent to a hole according to some embodiments of the inventive concept.

FIG. 1 is a perspective view of an electronic device according to some embodiments of the inventive concept. FIG. 2A is an exploded perspective view of an electronic device according to some embodiments of the inventive concept. FIG. 2B is a block diagram of an electronic device according to some embodiments of the inventive concept. FIG. 3 is a plan view of a display panel adjacent to a hole according to some embodiments of the inventive concept.

An electronic device 1000 may be a device activated in response to an electrical signal. The electronic device 1000 may include various embodiments. For example, the electronic device 1000 may include a tablet, a notebook computer, a computer, and a smart television. According to some embodiments, the electronic device 1000 is illustrated as a smart phone.

The electronic device 1000 may display an image IM in a third direction DR3 on a display surface FS parallel to each of a first direction DR1 and a second direction DR2. The display surface FS on which the image IM is displayed may correspond to a front surface of the electronic device 1000 and may correspond to a front surface FS of a window 300. Accordingly, the display surface FS of the electronic device 1000 and the front surface FS of the window 300 may use the same reference numerals. The image IM may include a still image as well as a dynamic image. In FIG. 1, a clock and a plurality of icons are illustrated as an example of the image IM.

According to some embodiments, a front surface (or upper surface) and a rear surface (or lower surface) of each member are defined based on a direction in which the image IM is displayed. The front surface and the rear surface may be opposite to each other in the third direction DR3, and a normal direction of each of the front surface and the rear surface may be parallel to the third direction DR3. A separation distance between the front surface and the rear surface in the third direction DR3 may correspond to a thickness in the third direction DR3 of the electronic device 1000.

The electronic device 1000 according to some embodiments of the inventive concept may sense a user's input TC applied from the outside. The user's input TC includes various types of external inputs, such as a part of a user's body, light, heat, or pressure. According to some embodiments, the user's input TC is illustrated as a user's hand applied to the front surface FS of the window 300. However, this is illustrated as a way of example, and as described above, the user's input TC may be provided in various types, and the electronic device 1000 may sense the user's input applied to a side or a rear side of the electronic device 1000 depending on a structure of the electronic device 1000, and is not limited to any one embodiment.

Meanwhile, according to some embodiments, a first area A1 may be defined in a transmission area TA. The first area A1 may be an area overlapping an electronic module 400 of the display modules 100 to be described later. A hole MH (refer to FIG. 2A) through which a display module 100 passes may be defined in the first area A1. FIG. 1 illustrates that the hole MH is defined in an upper right corner of the display module 100 in a single circular shape, but the number and shape of the hole MH is not limited thereto. Also, various numbers and shapes of the hole MH may be provided in the display module 100 depending on the number and shape of the electronic module 400.

The electronic device 1000 may receive an external signal required for the electronic module 400 through the first area A1 or may provide a signal output from the electronic module 400 to the outside. According to some embodiments, the first area A1 may be provided to overlap the transmission area TA, and thus the area of a bezel area BZA for forming the transmission area TA may be reduced.

Referring to FIG. 2A, the electronic device 1000 may include a display module 100, a housing 200, a window 300, and an electronic module 400. The window 300 and the housing 200 are assembled to form an exterior of the electronic device 1000.

The window 300 may include an insulating panel. For example, the window 300 may be formed of glass, plastic, or a combination thereof.

As described above, a front surface FS of the window 300 defines the front surface FS of the electronic device 1000. The window 300 may include a transmission area TA and a bezel area BZA adjacent to the transmission area TA. The transmission area TA may be an optically transparent area. For example, the transmission area TA may be an area having a visible light transmittance of about 90% or more. The bezel area BZA may be an area having relatively low light transmittance compared to the transmission area TA. The bezel area BZA defines a shape of the transmission area TA.

The bezel area BZA may have a certain color. The bezel area BZA may be defined by a bezel layer provided separately from a transparent substrate defining the transmission area TA, or may be defined by an ink layer formed by being inserted or colored in the transparent substrate.

The display module 100 may include an electronic panel EP and a driving circuit IC.

The electronic panel EP may display the image IM and sense the external input TC. A front surface IS of the electronic panel EP includes an active area AA and a peripheral area NAA. The active area AA may be an area activated in response to an electrical signal.

According to some embodiments, the active area AA may be an area in which the image IM is displayed and may be an area in which the external input TC is sensed. The active area AA may be an area in which a plurality of pixels PXij, which will be described later, are located.

The active area AA overlaps at least a portion of the transmission area TA. For example, the transmission area TA overlaps the entire surface or at least a portion of the active area AA. Accordingly, a user may recognize the image IM through the transmission area TA or may provide the external input TC. However, this is illustrated as a way of example, and an area in which the image IM is displayed and an area in which the external input TC is sensed may be separated from each other, in the active area AA, and the inventive concept is not limited to any one embodiment.

The peripheral area NAA may be an area covered by the bezel area BZA. The peripheral area NAA is adjacent to the active area AA. The peripheral area NAA may surround the active area AA. The peripheral area NAA may be an area in which the image IM is not displayed. A driving circuit or a driving wiring for driving the active area AA may be located in the peripheral area NAA.

According to some embodiments, the electronic panel EP is assembled in a flat state in which the active area AA and the peripheral area NAA face the window 300. However, this is illustrated as a way of example, and a portion of the peripheral area NAA of the electronic panel EP may be bent. For example, a portion of the peripheral area NAA may face the rear surface of the electronic device 1000, and thus the bezel area BZA exposed by the front surface of the electronic device 1000 may be reduced. Alternatively, the electronic panel EP may be assembled in a state where a portion of the active area AA is bent. Alternatively, in the electronic panel EP according to some embodiments, the peripheral area NAA may be omitted.

The active area AA may include a first area A1 and a second area A2. According to some embodiments, the first area A1 may have a relatively higher light transmittance than the second area A2. For example, the first area A1 may be an area in which a hole MH through which the display module 100 passes is defined.

The first area A1 may be defined as an area overlapping an area in which the electronic module 400 of the display module 100 is located. The first area A1 may include a margin area MA (refer to FIG. 4), which will be described later, and a hole area HA (refer to FIG. 4) corresponding to the hole MH.

According to some embodiments, the hole MH defined in the first area A1 is shown in a circular shape, but the hole MH may have various shapes such as a polygon, an ellipse, or a figure having at least one curved line, and is not limited to any one embodiment.

The second area A2 is adjacent to the first area A1. According to some embodiments, the second area A2 is illustrated as surrounding the entire first area A1, but this is illustrated as an example. Also, the second area A2 may be defined adjacent to only a portion of an edge of the first area A1, and is not limited to any one embodiment. In the present specification, the second area A2 may be defined as a "pixel area".

The electronic panel EP may include a flat portion FN and a bending portion BN. The flat portion FN may be assembled in a state substantially parallel to a plane defined by the first direction DR1 and the second direction DR2. The active area AA may be provided in the flat portion FN.

The bending portion BN may extend from the flat portion FN and be bent, and the bending portion BN may be assembled to be positioned on a rear side of the flat portion FN. The bending portion BN may be assembled to overlap the flat portion FN on a plane, and thus the bezel area of the electronic device 1000 may be reduced. Meanwhile, this is illustrated as a way of example, and in the electronic panel EP, the bending portion BN may be omitted.

The driving circuit IC may be mounted on the bending portion BN. The driving circuit IC provided in a form of a chip is illustrated according to some embodiments, but embodiments according to the present disclosure are not limited thereto. The driving circuit IC may be provided on a separate circuit board and electrically connected to the electronic panel EP through a flexible film.

The driving circuit IC is electrically connected to the active area AA to transmit an electrical signal to the active area AA. For example, the driving circuit IC may include a data driving circuit and may provide data signals to pixels located in the active area AA. Alternatively, the driving circuit IC may include a touch driving circuit and may be electrically connected to an input sensor located in the active area AA. Meanwhile, this is described as an example, and the driving circuit IC may include various circuits in addition to the above-described circuits or may be designed to provide various electrical signals to the active area AA, and is not limited to any one embodiment.

Meanwhile, the electronic device 1000 according to some embodiments may further include a main circuit board electrically connected to the electronic panel EP and the driving circuit IC. The main circuit board may include various driving circuits for driving the electronic panel EP or connectors for supplying power. The main circuit board may be a rigid printed circuit board (PCB), but is not limited thereto, and may be a flexible circuit board, but is not limited to any one embodiment.

The electronic module 400 is located below the display module 100. The electronic module 400 may receive an external input transmitted through the first area A1 or may output a signal through the first area A1. According to some embodiments, the first area A1 having a relatively high transmittance may be provided inside the active area AA, and thus the electronic module 400 may be arranged to overlap the active area AA. Accordingly, increase of the bezel area BZA may be prevented or reduced.

Referring to FIG. 2B, the electronic device 1000 may include a display module 100, a power supply module PM, a first electronic module EM1, and a second electronic module EM2. The display module 100, the power supply module PM, the first electronic module EM1, and the second electronic module EM2 may be electrically connected to each other.

In FIG. 2B, a display panel 110 and an input sensor 120 are illustrated among configurations of the display module 100. The display panel 110 may be configured to generate the image IM. The image IM generated by the display panel 110 is displayed on the display surface IS through the transmission area TA and visually recognized by the user from the outside. The input sensor 120 detects the external input TC applied from the outside. As described above, the input sensor 120 may detect the external input TC provided to the window 300.

The power supply module PM supplies power required for the overall operation of the electronic device 1000. The power supply module PM may include a conventional battery module.

The first electronic module EM1 and the second electronic module EM2 include various functional modules for operating the electronic device 1000. The first electronic module EM1 may be directly mounted on a motherboard electrically connected to the electronic panel EP, or may be mounted on a separate board and electrically connected to the motherboard through a connector.

The first electronic module EM1 may include a control module CM, a wireless communication module TM, an image input module IIM, an audio input module AIM, a memory MM, and an external interface IF. Some of the modules may not be mounted on the motherboard, but may be electrically connected to the motherboard through a flexible circuit board.

The control module CM controls the overall operation of the electronic device 1000. The control module CM may be a microprocessor. For example, the control module CM activates or deactivates the display module 100. The control module CM may control other modules, such as the image input module IIM and the audio input module AIM, based on a touch signal received from the electronic panel EP.

The wireless communication module TM may transmit/receive a wireless signal with another terminal using a Bluetooth or Wi-Fi line. The wireless communication module TM may transmit/receive a voice signal using a general communication line. The wireless communication module TM includes a transmitter TM1 that modulates and transmits a signal to be transmitted, and a receiver TM2 that demodulates the received signal.

The image input module IIM processes an image signal and converts the image signal into image data displayable on the electronic panel EP. The audio input module AIM receives an external audio signal by a microphone in a recording mode, and an audio recognition mode, and converts the external audio signal into electrical voice data.

The external interface IF serves as an interface connected to an external charger, a wired/wireless data port, or a card socket (e.g., a memory card, SIM/UIM card).

The second electronic module EM2 may include an audio output module AOM, a light emitting module LM, a light receiving module LRM, and a camera module CMM. The components may be directly mounted on the motherboard, mounted on a separate board and electrically connected to the electronic panel EP through a connector, or electrically connected to the first electronic module EM1.

The audio output module AOM converts the audio data received from the wireless communication module TM or from the audio data stored in the memory MM, and outputs the audio data to the outside.

The light emitting module LM generates and outputs light. The light emitting module LM may output infrared light. The light emitting module LM may include an LED element. The light receiving module LRM may detect infrared light. The light receiving module LRM may be activated when infrared light of a predetermined level or more are sensed. The light receiving module LRM may include a CMOS sensor. After the infrared light generated by the light emitting module LM is output, the infrared light is reflected by an external object (e.g., a user's finger or face), and the reflected infrared light may be incident on the light receiving module LRM. The camera module CMM captures an external image.

The electronic module 400 according to some embodiments may include at least one of the components of the second electronic module EM2. For example, the electronic module 400 may include at least one of a camera, a speaker, an optical sensor, or a thermal sensor. The electronic module 400 may detect an external object received through the first area A1 or may provide a sound signal, such as a voice, to the outside through the first area A1. Also, the electronic module 400 may include a plurality of components, and is not limited to any one embodiment. Meanwhile, according to some embodiments, the electronic module 400 may be attached to the electronic panel EP through a separate adhesive.

Referring again to FIG. 2A, the housing 200 is coupled to the window 300. The housing 200 is coupled to the window 300 to provide a certain internal space. The display module 100 and the electronic module 400 may be accommodated in the internal space.

The housing 200 may include a material having a relatively high rigidity. For example, the housing 200 may include a plurality of frames and/or plates formed of glass, plastic, metal, or a combination thereof. The housing 200 may stably protect the components of the electronic device 1000 accommodated in the internal space from external impact.

FIG. 3 illustrates a portion of the active area AA adjacent to the hole MH in the display panel 110.

The pixels PX included in the display panel 110 are arranged around the hole MH, are spaced apart from the first area A1, and are located in the second area A2. The hole MH may be defined in the active area AA. Accordingly, at least some of the pixels PX may be located adjacent to the hole MH. Some of the pixels PX may surround the hole MH.

At least one insulation opening VA may be defined in the first area A1 of the display panel 110. The insulation opening VA may be formed through at least one of insulating layers included in the display panel 110. A detailed description will be given later.

The insulation opening VA is arranged along the edge of the hole MH in a plan view. The insulation opening VA may be located closer to the second area A2 than the hole MH. In a plan view, the insulation opening VA may have a closed-line shape surrounding the hole MH. Although the shape of the insulation opening VA and the hole MH on a plane is circular in FIG. 3, the shapes of the insulation opening VA and the hole MH may be different from each other. In addition, each of the insulation opening VA and the hole MH may be provided in a shape including a polygon, an ellipse, or a closed line shape including at least a portion of a curved line on a plane, or a shape including a plurality of patterns partially cut off, and is not limited to any one embodiment.

A plurality of signal lines SGL1 and SGL2 connected to the pixels PX may be located in the first area A1. The signal lines SGL1 and SGL2 are connected to the pixels PX, which are spaced apart from each other with the hole MH therebetween, via the first area A1. FIG. 3 illustrates two signal lines SGL1 and SGL2 among a plurality of signal lines connected to the pixels PX for easy of description.

The first signal line SGL1 extends in a first direction DR1. The first signal line SGL1 is connected to pixels in the same row arranged in the first direction DR1, among the pixels PX. The first signal line SGL1 will be described as corresponding to any one of scan lines connected to the pixels PX.

Some of the pixels connected to the first signal line SGL1 are located on a left side with respect to the hole MH, and other portions are located on a right side with respect to the hole MH. Accordingly, the pixels in the same row connected to the first signal line SGL1, even when some pixels are omitted based on the hole MH, may be turned on/off by substantially the same scan signal.

The second signal line SGL2 extends in a second direction DR2. The second signal line SGL2 is connected to pixels in the same column arranged in the second direction DR2 among the pixels PX. It will be described that the second signal line SGL2 corresponds to any one of data lines connected to the pixels PX.

Some of the pixels connected to the second signal line SGL2 are located on an upper side with respect to the hole MH, and other portions are located on a lower side with respect to the hole MH. Accordingly, the pixels in the same column connected to the second signal line SGL2, even when some pixels are omitted with respect to the hole MH, may receive the data signal through the same.

However, the connection between the pixels PX spaced apart with the hole MH therebetween is not limited thereto, and at least one of the first signal line SGL1 and the second signal line SGL2 may be disconnected in the first area A1, and may further include a connection pattern located on a different layer from the disconnected signal line to connect the disconnected portion.

Figure 4:
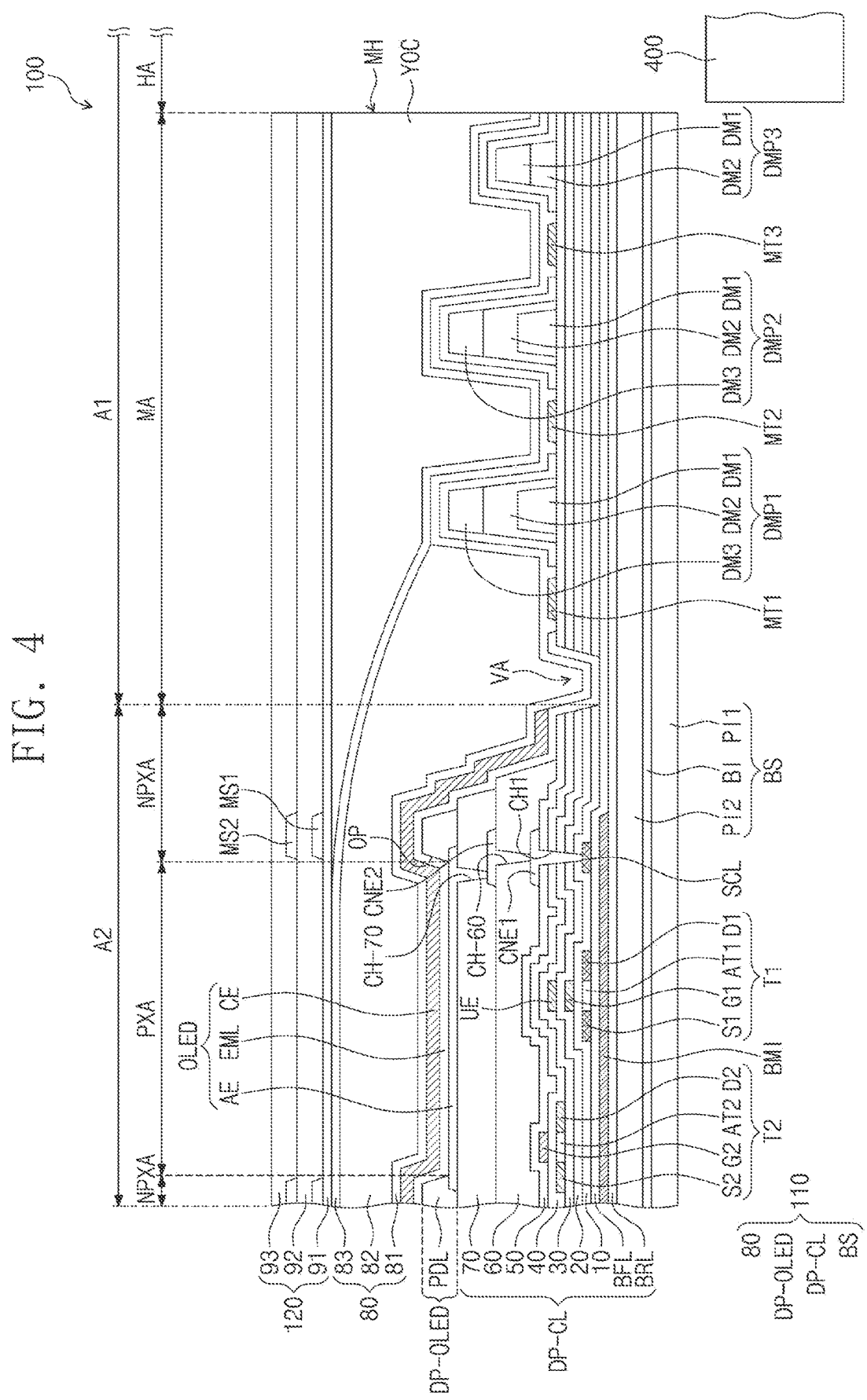
FIG. 4 is a cross-sectional view of a display module adjacent to a hole according to some embodiments of the inventive concept.
Figure 5:
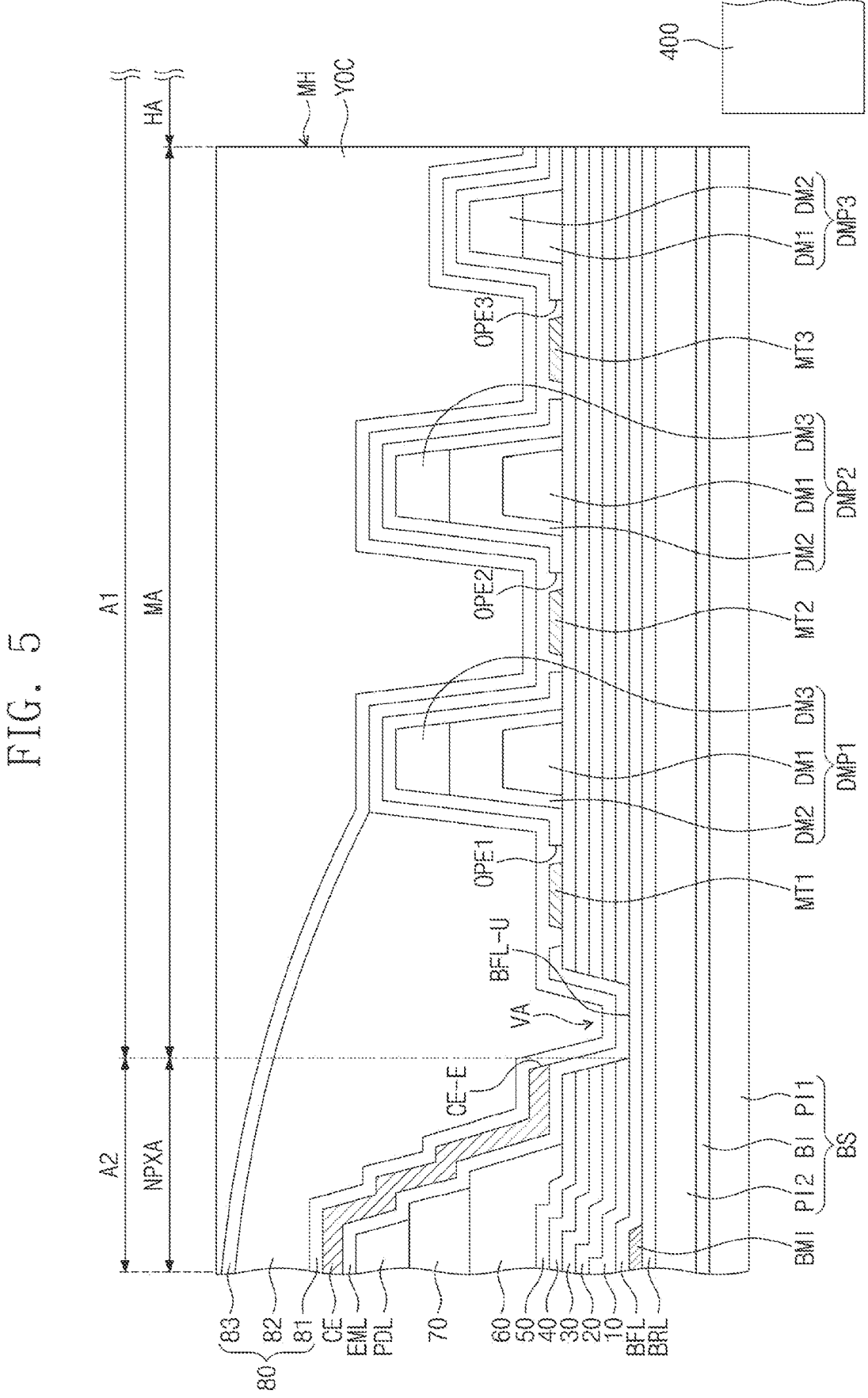
FIG. 5 is an enlarged cross-sectional view of an area of FIG. 4.

FIG. 4 is a cross-sectional view of a display module adjacent to a hole according to some embodiments of the inventive concept. FIG. 5 is an enlarged cross-sectional view of an area of FIG. 4.

Referring to FIGS. 4 and 5, a display module 100 according to some embodiments may include a display panel 110 and an input sensor 120. The input sensor 120 may be directly located on the display panel 110. The display panel 110 may include a base layer BS, a circuit element layer DP-CL, a display element layer DP-OLED, and an encapsulation layer 80. The display module 100 may include a first area A1 and a second area A2 surrounding at least a portion of the first area A1.

The first area A1 may include a margin area MA and a hole area HA. The margin area MA may be defined as an area to which a laser beam is irradiated in a process of removing a second electrode CE of a light emitting device OLED from the first area A1 in a method of manufacturing the display panel 110 according to some embodiments. The hole area HA may be defined as an area in which the hole MH is formed.

The second area A2 (pixel area) may include a light emitting area PXA and a non-light emitting area NPXA. The light emitting area PXA may correspond to a display opening OP of a pixel defining layer PDL. The non-light emitting area NPXA may be adjacent to the light emitting area PXA.

The display panel 110 may further include functional layers such as an anti-reflection layer and a refractive index control layer. The circuit element layer DP-CL includes at least a plurality of insulating layers and a circuit element. Hereinafter, the insulating layers may include an organic layer and/or an inorganic layer.

An insulating layer, a semiconductor layer, and a conductive layer are formed on the base layer BS by coating, or deposition. Thereafter, the insulating layer, the semiconductor layer, and the conductive layer may be selectively patterned by photolithography. In this way, a semiconductor pattern, a conductive pattern, and a signal line are formed.

The base layer BS may be a foundation layer on which the remaining components of the circuit element layer DP-CL are located. The base layer BS may have a structure in which layers including an organic material and layers including an inorganic material are alternately stacked. For example, according to some embodiments, the base layer BS may include a first base layer PI1, a cover layer BI, and a second base layer PI2.

The first base layer PI1 may be located on the lowermost surface. The first base layer PI1 may include an organic material. For example, the first base layer PI1 may include any one of polyimide (PI), polyethylene naphthalate (PEN), polyethylene terephthalate (PET), polyarylate, polycarbonate (PC), polyetherimide (PEI), and polyethersulfone (PES).

The cover layer BI may be located on the first base layer PI1. The cover layer BI may include an inorganic material. For example, the cover layer BI may include at least one of silicon oxide, silicon oxynitride, aluminum oxide, titanium oxide, silicon nitride, zirconium oxide, hafnium oxide, or amorphous silicon.

The second base layer PI2 may be located on the cover layer BI. The second base layer PI2 may include an organic material. The organic material included in the second base layer PI2 may be the same as the organic material included in the first base layer BI1.

However, embodiments according to the inventive concept are not limited thereto, and the base layer BS may be provided as a single layer. In this case, the base layer BS may include a synthetic resin film. The synthetic resin film may include a thermosetting resin. In particular, the synthetic resin film may be a polyimide-based resin layer, and the material thereof is not particularly limited. In addition, the base layer BS may include glass, metal, or an organic/inorganic composite material.

A barrier layer BRL may be located on the base layer BS. The barrier layer BRL may include an inorganic material. For example, the barrier layer BRL may include at least one of silicon oxide, aluminum oxide, titanium oxide, silicon nitride, silicon oxynitride, zirconium oxide, or hafnium oxide.

A buffer layer BFL may be located on the barrier layer BRL. The buffer layer BFL improves a bonding force between the barrier layer BRL and a semiconductor pattern and/or a conductive pattern. The buffer layer BFL may include a silicon oxide layer and a silicon nitride layer. In addition, the silicon oxynitrile layer may have a single-layer or multi-layer structure, and is not limited to any one embodiment.

A semiconductor pattern is located on the buffer layer BFL. Hereinafter, a semiconductor pattern directly located on the buffer layer BFL is defined as a first semiconductor pattern. The first semiconductor pattern may include a silicon semiconductor. For example, the first semiconductor pattern may include polysilicon. However, embodiments according to the inventive concept are not limited thereto, and the first semiconductor pattern may include amorphous silicon.

FIG. 4 only illustrates a portion of a first semiconductor pattern, and the first semiconductor pattern may be further located in another area of the pixel PX (refer to FIG. 3). The first semiconductor pattern has different electrical characteristics depending on whether the first semiconductor pattern is doped or not. The first semiconductor pattern may include a doped region and a non-doped region. The doped region may be doped with an N-type dopant or a P-type dopant. A P-type transistor includes a doped region doped with a P-type dopant.

A source S1, an active AT1, and a drain D1 of a first transistor T1 are formed from the first semiconductor pattern. The source S1 and the drain D1 of the first transistor T1 are formed to be spaced apart from each other with the active AT1 interposed therebetween.

A connection signal line SCL may be located on the buffer layer BFL. The connection signal line SCL may be connected to any one of a plurality of transistors included in the pixel PX.

A light blocking layer BMI may be located on the buffer layer BFL. The light blocking layer BMI may include a metal. For example, the light blocking layer BMI may include molybdenum (Mo).

The buffer layer BFL may be covered by a first insulating layer 10.

The first insulating layer 10 may be located on the buffer layer BFL and cover the first semiconductor pattern and the connection signal line SCL. The first insulating layer 10 may be an inorganic layer and/or an organic layer, and may have a single-layer or multi-layer structure. The first insulating layer 10 may include at least one of aluminum oxide, titanium oxide, silicon oxide, silicon oxynitride, zirconium oxide, or hafnium oxide. According to some embodiments, the first insulating layer 10 may be a single-layer silicon oxide layer.

A gate G1 of the first transistor T1 is located on the first insulating layer 10. The gate G1 may be a portion of the metal pattern. The gate G1 of the first transistor T1 overlaps the active AT1 of the first transistor T1. In a process of doping the first semiconductor pattern, the gate G1 of the first transistor T1 may be used as a mask.

A second insulating layer 20 covering the gate G1 is located on the first insulating layer 10. The second insulating layer 20 may be an inorganic layer and/or an organic layer, and may have a single-layer or multi-layer structure. According to some embodiments, the second insulating layer 20 may be an inorganic layer and/or an organic layer, and may have a single-layer or multi-layer structure. According to some embodiments, the second insulating layer 20 may be a single-layer silicon nitride layer.

An upper electrode UE may be located on the second insulating layer 20. The upper electrode UE may overlap the gate G1. The upper electrode UE may be a portion of a metal pattern or a portion of a doped semiconductor pattern. A portion of the gate G1 and the upper electrode UE overlapping the portion of the gate G1 may define a capacitor included in the pixel PX. According to some embodiments of the inventive concept, the upper electrode UE may be omitted.

A third insulating layer 30 is located on the second insulating layer 20 to cover the upper electrode UE. According to some embodiments, the third insulating layer 30 may include at least one silicon oxide layer and a silicon nitride layer alternately stacked.

A semiconductor pattern is located on the third insulating layer 30. Hereinafter, the semiconductor pattern directly located on the third insulating layer 30 is defined as a second semiconductor pattern. The second semiconductor pattern may include a metal oxide. The oxide semiconductor may include a crystalline or amorphous oxide semiconductor.

For example, the oxide semiconductor may include a metal oxide including zinc (Zn), indium (In), gallium (Ga), tin (Sn), and titanium (Ti) and a mixture of metals such as zinc (Zn), indium (In), gallium (Ga), tin (Sn), titanium (Ti), and oxides thereof. The oxide semiconductor may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), or zinc-tin oxide (ZTO).

A source S2, an active AT2, and a drain D2 of a second transistor T2 are formed from the second semiconductor pattern. The source S2 and the drain D2 include metal reduced from the metal oxide semiconductor. The source S2 and the drain D2 may have a certain thickness from an upper surface of the second semiconductor pattern and may include a metal layer including the reduced metal.

A fourth insulating layer 40 covering the second semiconductor pattern is located on the third insulating layer 30. According to some embodiments, the fourth insulating layer 40 may be a single-layer silicon oxide layer.

A gate G2 of the second transistor T2 is located on the fourth insulating layer 40. The gate G2 may be a portion of the metal pattern. The gate G2 of the second transistor T2 overlaps the active AT2 of the second transistor T2.

A fifth insulating layer 50 covering the gate G3 is located on the fourth insulating layer 40. According to some embodiments, the fifth insulating layer 50 may include at least one silicon oxide layer and a silicon nitride layer alternately stacked.

At least one insulating layer is further located on the fifth insulating layer 50. According to some embodiments, a sixth insulating layer 60 and a seventh insulating layer 70 may be located on the fifth insulating layer 50. The sixth insulating layer 60 and the seventh insulating layer 70 may be organic layers, and may have a single-layer or multi-layer structure. The sixth insulating layer 60 and the seventh insulating layer 70 may be a single polyimide-based resin layer.

Without being limited thereto, the fifth insulating layer 50 and the sixth insulating layer 60 may include at least one of an acrylic resin, a methacrylic resin, polyisoprene, a vinyl-based resin, an epoxy-based resin, a urethane-based resin, a cellulose-based resin, a siloxane-based resin, a polyamide-based resin, or a perylene-based resin.

A first connection electrode CNE1 may be located on the fifth insulating layer 50. The first connection electrode CNE1 may be connected to a connection signal line SCL through a first contact hole CH1 passing through the first to fifth insulating layers 10 to 50.

A second connection electrode CNE2 may be located on the sixth insulating layer 60. The second connection electrode CNE2 is connected to the first connection electrode CNE1 through a second contact hole CH-60 passing through the sixth insulating layer 60.

The light emitting device OLED is located on the seventh insulating layer 70. A first electrode AE of the light emitting device OLED is located on the seventh insulating layer 70. The pixel defining layer PDL is located on the seventh insulating layer 70. The display opening OP exposing at least a portion of the first electrode AE may be defined in the pixel defining layer PDL. According to some embodiments, the pixel defining layer PDL may include a light absorbing material. For example, the pixel defining layer PDL may have a black color.

The display opening OP of the pixel defining layer PDL may define the light emitting area PXA. For example, the plurality of pixels PX (refer to FIG. 3) may be arranged in a regular manner, on a plane of the display panel 110. An area in which the plurality of pixels PX are located may be defined as the second area A2 (pixel area), and one pixel area includes a light emitting area PXA and a non-light emitting area NPXA adjacent to the light emitting area PXA. The non-light emitting area NPXA may surround the light emitting area PXA.

The first electrode AE is located on the seventh insulating layer 70. The first electrode AE is connected to the second connection electrode CNE2 through a second contact hole CH-70 penetrating the seventh insulating layer 70. The first electrode AE may be individually patterned and located in each of the plurality of pixels PX (refer to FIG. 3).

An organic layer EML is located on the first electrode AE. In the present specification, the organic layer EML may be defined as including a hole control layer, an emission layer, and an electron control layer. The material included in the emission layer is not limited to any one embodiment as long as it generates light. The hole control layer may include a hole transport layer and a hole injection layer. The electron control layer may include an electron transport layer and an electron injection layer.

The hole control layer and the electron control layer included in the organic layer EML which are deposited through an open mask may be a common layer formed on the entire first area A1 and the second area A2. The emission layer may be located between the hole control layer and the electron control layer and may be provided in a patterned form to each of the pixels PX. In this case, the emission layer may be formed through a fine metal mask (FMM).

The second electrode CE is located on the organic layer EML. According to some embodiments, the second electrode CE may be located only in the second area A2 and may be spaced apart from the first area A1. According to some embodiments, the second electrode CE may have an electrode opening corresponding to the margin area MA. The electrode opening may surround the margin area MA in a plan view. The electrode opening may be defined as an edge CE-E of the second electrode CE adjacent to a boundary between the first area A1 and the second area A2.

The encapsulation layer 80 may include a first inorganic layer 81, a thin organic layer 82, and a second inorganic layer 83. However, embodiments according to the present disclosure are not limited thereto, and the encapsulation layer 80 may further include a plurality of inorganic layers and organic layers.

The first inorganic layer 81 may be in contact with the second electrode CE. The first inorganic layer 81 may prevent or reduce instances of external moisture, oxygen, or other contaminants penetrating into the organic layer EML. For example, the first inorganic layer 81 may include silicon nitride, silicon oxide, or a combination thereof. The first inorganic layer 81 may be formed through a deposition process.

The thin organic layer 82 may be located on the first inorganic layer 81 to be in contact with the first inorganic layer 81. The thin organic layer 82 may provide a flat surface on the first inorganic layer 81. An uneven upper surface of the first inorganic layer 81 or particles existing on the first inorganic layer 81 may be covered by the thin organic layer 82, and thus the upper surface of the first inorganic layer 81 may block influence on components formed on the thin organic layer 82. The thin organic layer 82 may include an organic material and may be formed through a solution process such as spin coating, slit coating, or inkjet process.

During the solution process for forming the thin organic layer 82, the solution containing the organic material may be applied only to a first dam part DMP1. Accordingly, a boundary of the thin organic layer 82 on a plane may be determined by the first dam part DMP1.

The second inorganic layer 83 is located on the thin organic layer 82 to cover the thin organic layer 82. The second inorganic layer 83 located on the thin organic layer 82 may be stably formed on a relatively flat surface than the second inorganic layer 83 located on the first inorganic layer 81. The second inorganic layer 83 seals moisture introduced from the thin organic layer 82 and prevents or reduce instances of moisture or other contaminants flowing to the outside. The second inorganic layer 83 may include silicon nitride, silicon oxide, or a combination thereof. The second inorganic layer 83 may be formed through a deposition process.

A planarization layer YOC may compensate for a step formed by the thin organic layer 82 and the second inorganic layer 83 in the second area A2 adjacent to the first area A1 and the first area A1. Accordingly, the input sensor 120 located on the second inorganic layer 83 and the planarization layer YOC layer may be formed on a flat surface. The planarization layer YOC according to some embodiments may include an organic material.

The input sensor 120 may be formed directly on the encapsulation layer 80. The input sensor 120 may include a plurality of conductive patterns MS1 and MS2 and sensing insulating layers 91, 92, and 93. The sensing insulating layers 91, 92, and 93 may include a first sensing insulating layer 91, a second sensing insulating layer 92, and a third sensing insulating layer 93.

The first sensing insulating layer 91 is located on the encapsulation layer 80. The first conductive patterns MS1 may be located on the first sensing insulating layer 91 and covered by the second sensing insulating layer 92. The second conductive patterns MS2 may be located on the second sensing insulating layer 92 and covered by the third sensing insulating layer 93.

Each of the conductive patterns MS1 and MS2 has conductivity. Each of the conductive patterns MS1 and MS2 may be provided as a single layer or as a plurality of layers, but is not limited to any one embodiment. At least one of the conductive patterns MS1 and MS2 according to some embodiments may be provided as mesh lines on a plane.

The mesh lines constituting the conductive patterns MS1 and MS2 may overlap the non-light emitting area NPXA and may be spaced apart from the light emitting area PXA. Accordingly, even when the input sensor 120 is directly formed on the display panel 110, the light formed from the pixels PX (refer to FIG. 3) of the display panel 110 may be provided to a user without interference from the input sensor 120.

In the display module 100 according to some embodiments, a hole MH through which the hole area HA is defined may be defined. The hole MH may pass through the base layer BS overlapping the hole area HA, the first to fifth insulating layers 10, 20, 30, 40, and 50, the planarization layer YOC, and first and second inorganic layers 81 and 83, and the first to third sensing insulating layers 91, 92, and 93, and the side surfaces thereof may be aligned with each other.

In the display module 100 according to some embodiments, as the hole MH through which the display module 100 penetrates is defined in the second area A2, a structure blocking a path, through which moisture and oxygen flowing into the hole MH are introduced into the second area A2 in which the pixels is located, is required.

The electronic module 400 is located under the display module 100 overlapping the hole MH. According to some embodiments, the electronic module 400 located under the display module 100 may include at least one of the light emitting module LM, the light receiving module LRM, and the camera module CMM described with reference to FIG. 2B.

The circuit element layer DP-CL according to some embodiments may include first to third dam parts DMP1, DMP2, and DMP3, and first to third metal patterns MT1, MT2, and MT3 located in the margin area MA of the first area A1. In addition, an insulation opening VA may be defined through which the first to fifth insulating layers 10, 20, 30, 40, and 50 pass, in the first to fifth insulating layers 10, 20, 30, 40, and 50 overlapping the margin area MA. First to third organic openings OPE1, OPE2, and OPE3 exposing the corresponding to the first to third metal patterns MT1, MT2, and MT3 may be defined in the organic layer EML overlapping the margin area MA.

The first to third dam parts DMP1, DMP2, and DMP3 may be located on the fifth insulating layer 50. Each of the first to third dam parts DMP1, DMP2, and DMP3 may be covered by the organic layer EML to be in contact with the organic layer EML.

The first dam part DMP1 may be located closest to the second area A2 among the first to third dam parts DMP1, DMP2, and DMP3. The second dam part DMP2 may be located between the first dam part DMP1 and the third dam part DMP3, and the third dam part DMP3 may be located closest to the hole MH. The third dam part DMP3 may surround the hole MH, the second dam part DMP2 may surround the third dam part DMP3, and the first dam part DMP1 may surround the second dam part DMP2. The first dam part DMP1 may be a wall defining a boundary between the thin organic layer 82 of the encapsulation layer 80. At least one of the second or third dam parts DMP2 or DMP3 may be omitted.

According to some embodiments, each of the first to third dam parts DMP1, DMP2, and DMP3 may be provided in a multilayer structure. The first and second dam parts DMP1 and DMP2 may include first to third layers DM1, DM2 and DM3 that are sequentially stacked, and the third dam part DMP3 may include first and second layers DM1 and DM2 that are sequentially stacked. The first layer DM1 may be formed in the same process to have the same material as that of the seventh insulating layer 70, and the second layer DM2 may be formed in the same process as the pixel defining layer PDL to have the same material as that of the pixel defining layer PDL. The third layer DM3 may include an organic material.

According to some embodiments, a thickness of the third dam part DMP3 may be smaller than a thickness of the first and second dam parts DMP1 and DMP2.

The first inorganic layer 81 and the second inorganic layer 83 may seal the thin organic layer 82 in the second area A2, and the first inorganic layer 81 and the second inorganic layer 83 may be in contact with each other from a top surface of the first dam part DMP1 to the hole area HA in the first area A1.

The first to third metal patterns MT1, MT2, and MT3 may be located on the fifth insulating layer 50. The first metal pattern MT1 may be located between the edge CE-E of the second electrode CE adjacent to the first area A1 and the first dam part DMP1. The second metal pattern MT2 may be located between the first dam part DMP1 and the second dam part DMP2. The third metal pattern MT3 may be located between the second dam part DMP2 and the third dam part DMP3.

The first to third metal patterns MT1, MT2, and MT3 may include any one of metals included in the first connection electrode CNE1. For example, when the first connection electrode CNE1 includes sequentially stacked titanium (Ti), aluminum (Al), and titanium (Ti), the first to third metal patterns MT1, MT2, and MT3 may include titanium (Ti) located at a lower part. That is, the first to third metal patterns MT1, MT2, and MT3 may be metal patterns formed through an additional etching process for a conductive layer formed by the same process as the first connection electrode CNE1.

The first to third organic openings OPE1, OPE2, and OPE3 may be defined in the organic layer EML overlapping the margin area MA.

The first organic opening OPE1 may expose the first metal pattern MT1, the second organic opening OPE2 may expose the second metal pattern MT2, and the third organic opening OPE3 may expose the third metal pattern MT3. The first inorganic layer 81 may cover the first to third metal patterns MT1, MT2, and MT3 exposed by the first to third organic openings OPE1, OPE2, and OPE3.

According to some embodiments, in a region where the first to third metal patterns MT1, MT2, and MT3 are located, the organic layer EML may have a disconnected structure as the first to third organic openings OPE1, OPE2, and OPE3 are defined. Accordingly, the path through which moisture and oxygen flowing into the hole MH introduced into the second area A2 in which the pixel PX is located through the organic layer EML may be blocked. Therefore, the electronic device 1000 (refer to FIG. 1) with improved reliability may be provided.

The insulation opening VA may be defined in the first to fifth insulating layers 10, 20, 30, 40, and 50 overlapping the margin area MA. The insulation opening VA may be overlapped between the electrode opening defined by the edge CE-E of the second electrode CE adjacent to the boundary between the first area A1 and the second area A2, and the first metal pattern MT1. The insulation opening VA may expose a portion BFL-U of the buffer layer BFL.

The portion BFL-U of the buffer layer BFL exposed from the insulation opening VA may be covered by the organic layer EML. Also, the side surfaces of each of the first to fifth insulating layers 10, 20, 30, 40, and 50 defining the insulation opening VA may be covered by the organic layer EML.

As the display module 100 according to some embodiments includes the insulation opening VA, in the process of applying the laser beam to the first to third metal patterns MT1, MT2, and MT3, overprocessing of the edge CE-E of the second electrode CE may be prevented or reduced. Accordingly, the display panel 110 in which a shape of the edge CE-E of the second electrode CE is not deformed and step-coverage of the encapsulation layer 80 is improved may be provided. This will be described through a method of manufacturing a display module to be described in more detail later.

FIGS. 6A to 6L are cross-sectional views illustrating a method of manufacturing a display module according to some embodiments of the inventive concept. The same/similar reference numerals are used for the same/similar components as those described in FIGS. 4 and 5, and duplicate descriptions are omitted.

Figures 6A, 6B:
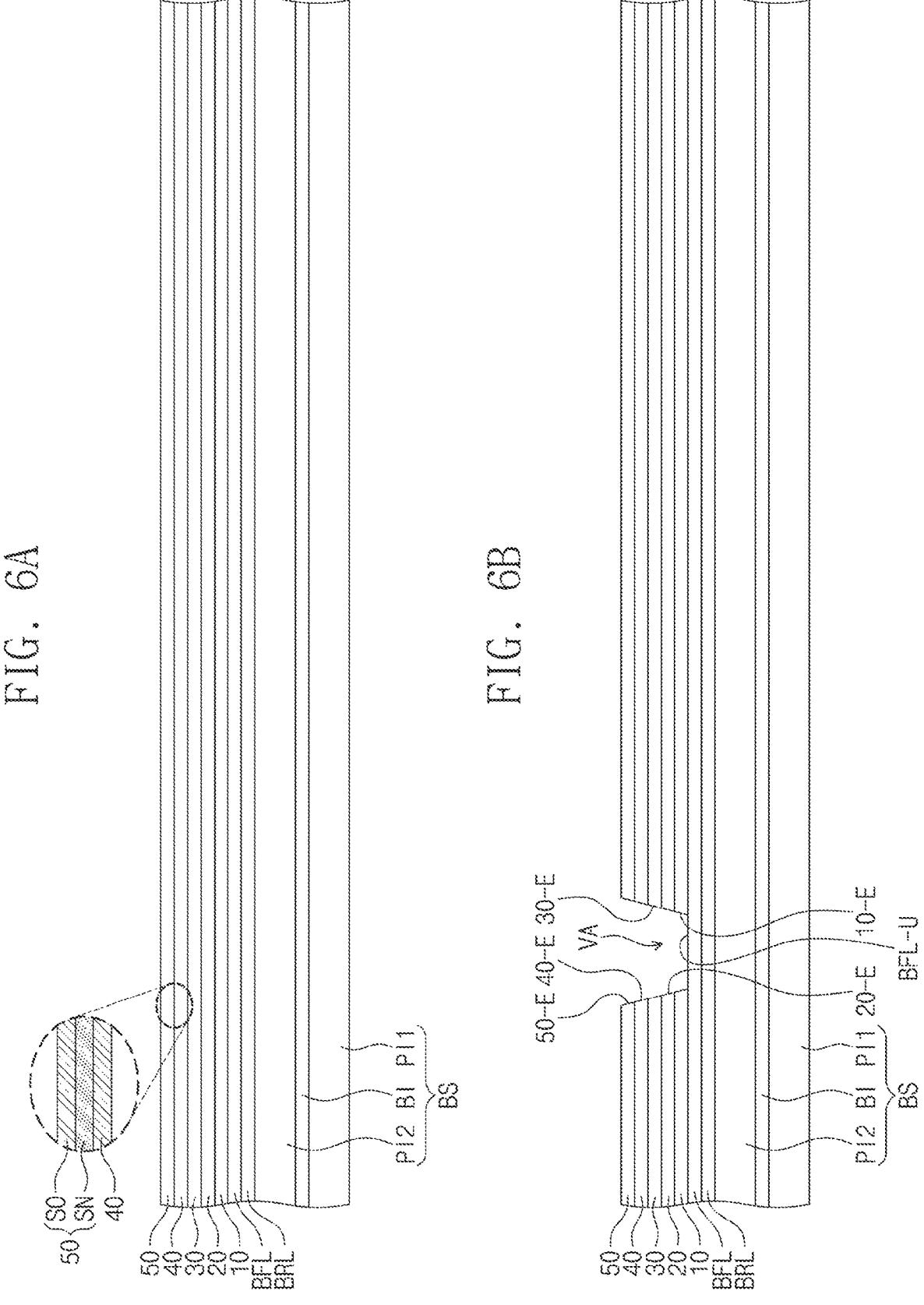

Referring to FIG. 6A, in a method of manufacturing a display module according to some embodiments, a barrier layer BRL, a buffer layer BFL, and first to fifth insulating layers 10, 20, 30, 40, and 50 may be formed on a base layer BS.

According to some embodiments, the first insulating layer 10 and the fourth insulating layer 40 may include a single layer of silicon oxide. The second insulating layer 20 may include a single layer of silicon nitride. The third insulating layer 30 and the fifth insulating layer 50 may include sequentially stacked silicon nitride and silicon oxide. A refractive index of the insulating layer including silicon nitride and a refractive index of the insulating layer including silicon oxide may be different from each other.

FIG. 6A is an enlarged view of the fourth insulating layer 40 and the fifth insulating layer 50 as an example. The fourth insulating layer 40 may include a single layer of silicon oxide, and the fifth insulating layer 50 may include a silicon nitride layer SN and a silicon oxide layer SO which are sequentially stacked.

According to some embodiments, a sequentially stacked silicon oxide layer-silicon nitride layer-silicon oxide layer may be formed between the first insulating layer 10 and the third insulating layer 30, and a sequentially stacked silicon oxide layer-a silicon nitride layer-a silicon oxide layer may be formed between the fourth insulating layer 40 and the fifth insulating layer 50.

Thereafter, referring to FIG. 6B, the method of manufacturing the display module according to some embodiments may include forming an insulation opening VA. The insulation opening VA may be formed to expose a portion BFL-U of the buffer layer BFL by removing the first to fifth insulating layers 10, 20, 30, 40, and 50. The insulation opening VA may be formed side surfaces 10-E, 20-E, 30-E, 40-E, and 50-E of the first to fifth insulating layers 10, 20, 30, 40, and 50, respectively, to be aligned with each other.

Although it is described that the insulation opening VA is formed by removing the first to fifth insulating layers 10, 20, 30, 40, and 50 according to some embodiments, the forming of the insulation opening VA is not limited thereto. For example, among the first to fifth insulating layers 10, 20, 30, 40, and 50, whatever a layer including silicon nitride and a layer located on the upper and lower portions of the layer including silicon nitride and having a refractive index different from that of silicon nitride are removed may be forming the insulation opening VA in the insulating layer, but is limited thereto.

Figures 6C, 6D:
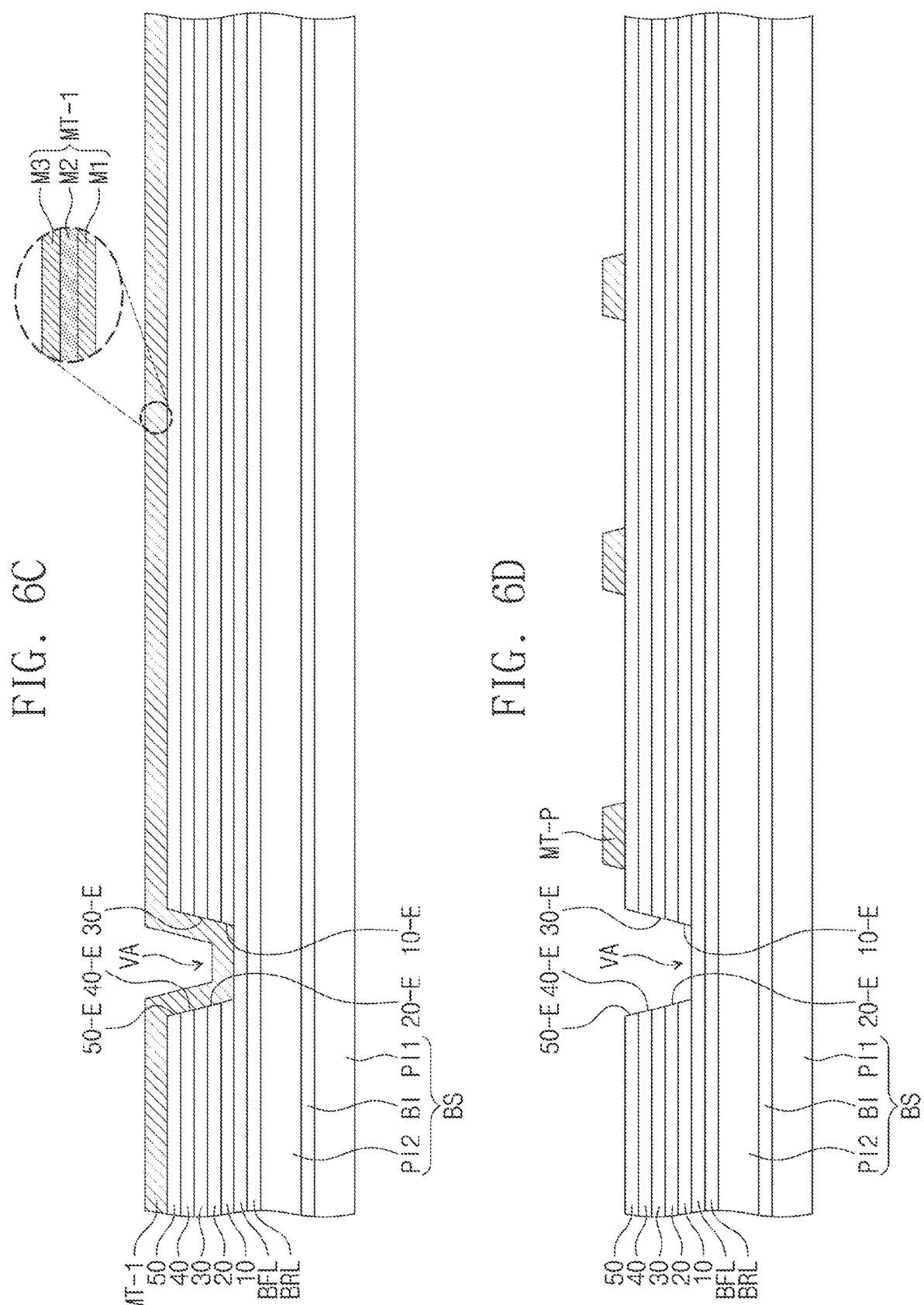

Thereafter, referring to FIG. 6C, the method of manufacturing the display module according to some embodiments may include forming a first metal layer MT-1. The first metal layer MT-1 may be formed on the fifth insulating layer 50 and cover the insulation opening VA. The first metal layer MT-1 according to some embodiments may include a lower layer M1, a middle layer M2, and an upper layer M3 that are sequentially stacked. The lower layer M1 and the upper layer M3 may include titanium (Ti), and the middle layer M2 may include aluminum (Al).

Thereafter, referring to FIG. 6D, the method of manufacturing the display module according to some embodiments may include forming preliminary metal patterns MT-P. The preliminary metal patterns MT-P may be formed by removing the first metal layer MT-1. The preliminary metal patterns MT-P may have the same layer structure as the lower layer M1, the middle layer M2, and the upper layer M3 included in the first metal layer MT-1. When the preliminary metal patterns MT-P are formed by patterning the first metal layer MT-1, a first connection electrode CNE1 described in FIG. 4 may be formed by patterning the first metal layer MT-1.

Figures 6E, 6F:
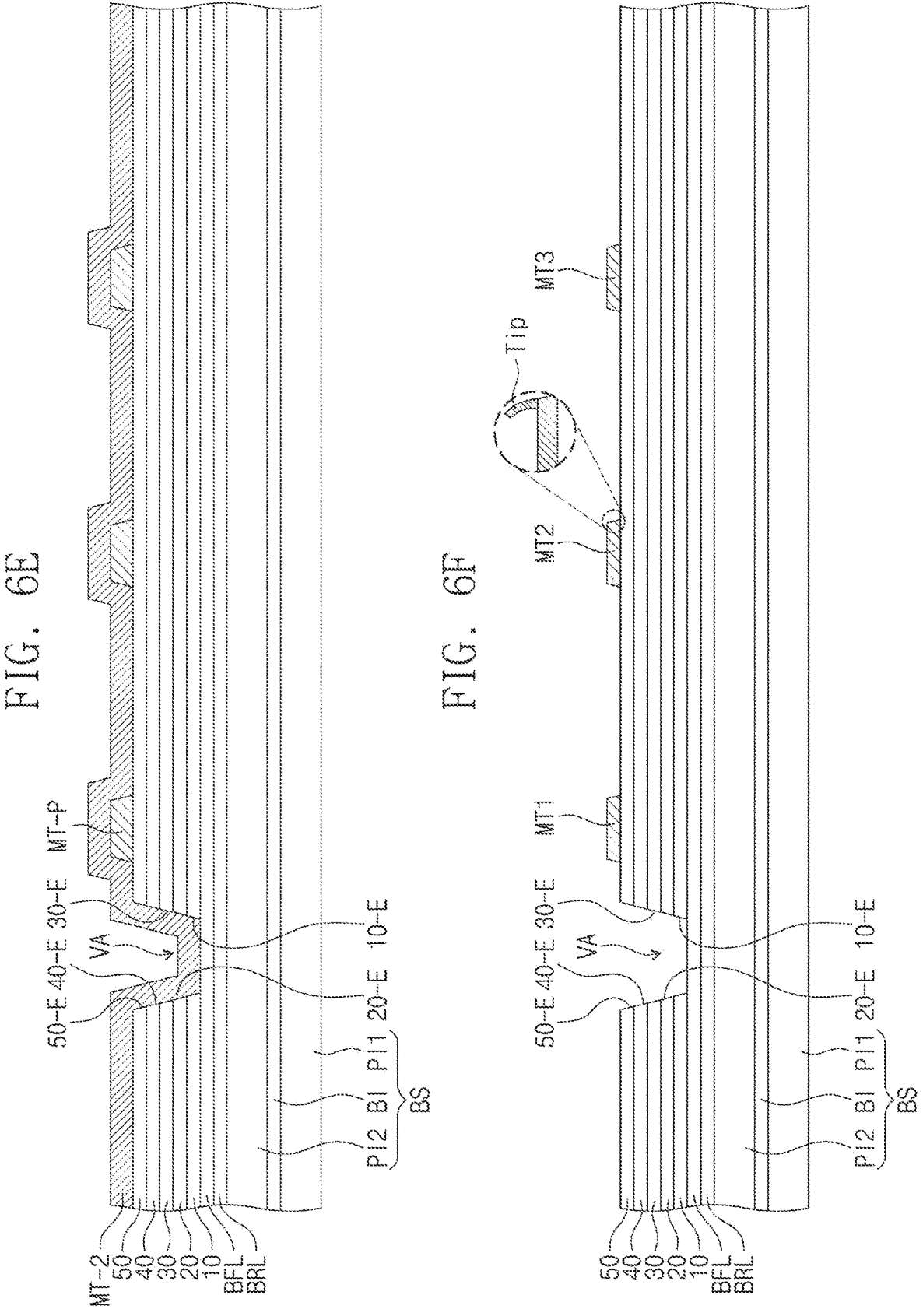

Thereafter, referring to FIG. 6E, the method of manufacturing the display module according to some embodiments may include forming a second metal layer MT-2. The second metal layer MT-2 may be formed on the fifth insulating layer 50 and may cover the insulation opening VA and the preliminary metal patterns MT-P. The second metal layer MT-2 may include a lower layer, a middle layer, and an upper layer that sequentially stacked, like the first metal layer MT-1. The lower layer and the upper layer may include titanium (Ti), and the middle layer may include aluminum (Al).

Thereafter, referring to FIG. 6F, the method of manufacturing the display module according to some embodiments may include forming first to third metal patterns MT1, MT2, and MT3. The first to third metal patterns MT1, MT2, and MT3 may be formed by removing the middle layer and the upper layer while remaining only the lower layer among the lower layer, the middle layer, and the upper layer included in the preliminary metal patterns MT-P.

The first to third metal patterns MT1, MT2, and MT3 may be formed by partially removing the second metal layer MT-2 and the preliminary metal patterns MT-P through an etching process. The second metal layer MT-2 and the preliminary metal patterns MT-P may be partially removed through a first etching process. The first etching process may be a dry etching process.

According to some embodiments, due to a step formed as the preliminary metal patterns MT-P and the second metal layer MT-2 are overlapped with each other, an etch rate difference may occur in a region in which only the second metal layer MT-2 is located and in a region in which the preliminary metal patterns MT-P and the second metal layer MT-2 are overlapped. A second etching process may be performed to remove the remaining middle and upper layers among the preliminary metal patterns MT-P. The second etching process may be a wet etching process.

At least one edge of the first to third metal patterns MT1, MT2, and MT3, the lower layer of the second metal layer MT-2 may remain in a form of a wall due to the etch rate difference from the step difference. The lower layer of the second metal layer MT-2 may include titanium (Ti), and may be defined as a tip part Tip in the present specification.

When the first to third metal patterns MT1, MT2, and MT3 are formed by patterning the second metal layer MT-2, a second connection electrode CNE2 described in FIG. 4 may be also formed by patterning the second metal layer MT-2.

Figure 6G:
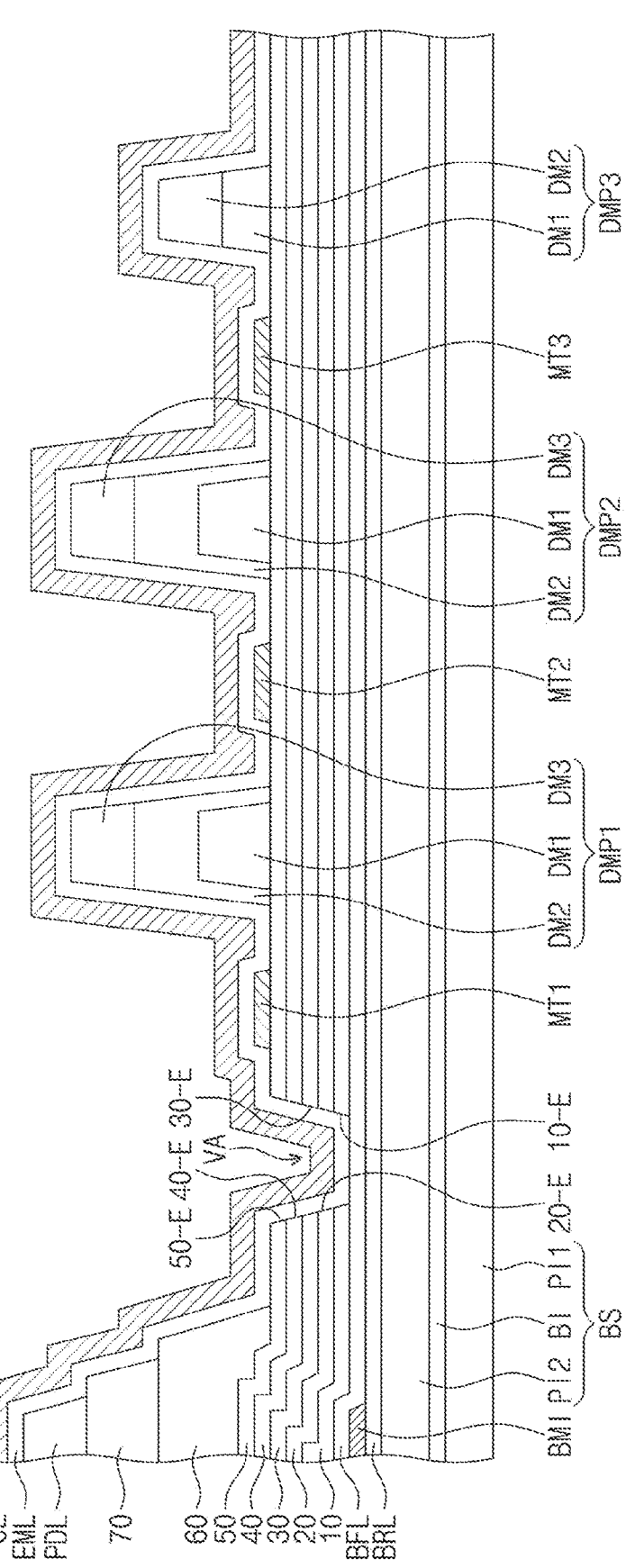

Thereafter, referring to FIG. 6G, the method of manufacturing the display module according to some embodiments may include forming an organic layer EML and a second electrode CE. The organic layer EML and the second electrode CE may constitute a light emitting device OLED described with reference to FIG. 4.

The organic layer EML and the second electrode CE may be formed on the entire fifth insulating layer 50. The organic layer EML may cover the side surfaces 10-E, 20-E, 30-E, 40-E, and 50-E of the first to fifth insulating layers 10, 20, 30, 40, and 50 and the portion of buffer layer BFL exposed through the insulation opening VA. The second electrode CE may be formed on the organic layer EML.

According to some embodiments, before the organic layer EML is formed on the fifth insulating layer 50, the method may further include forming a seventh insulating layer 70, a pixel defining layer PDL, and an additional organic layer and patterning them to form dam parts DMP1, DMP2, and DMP3.

Figure 6H:
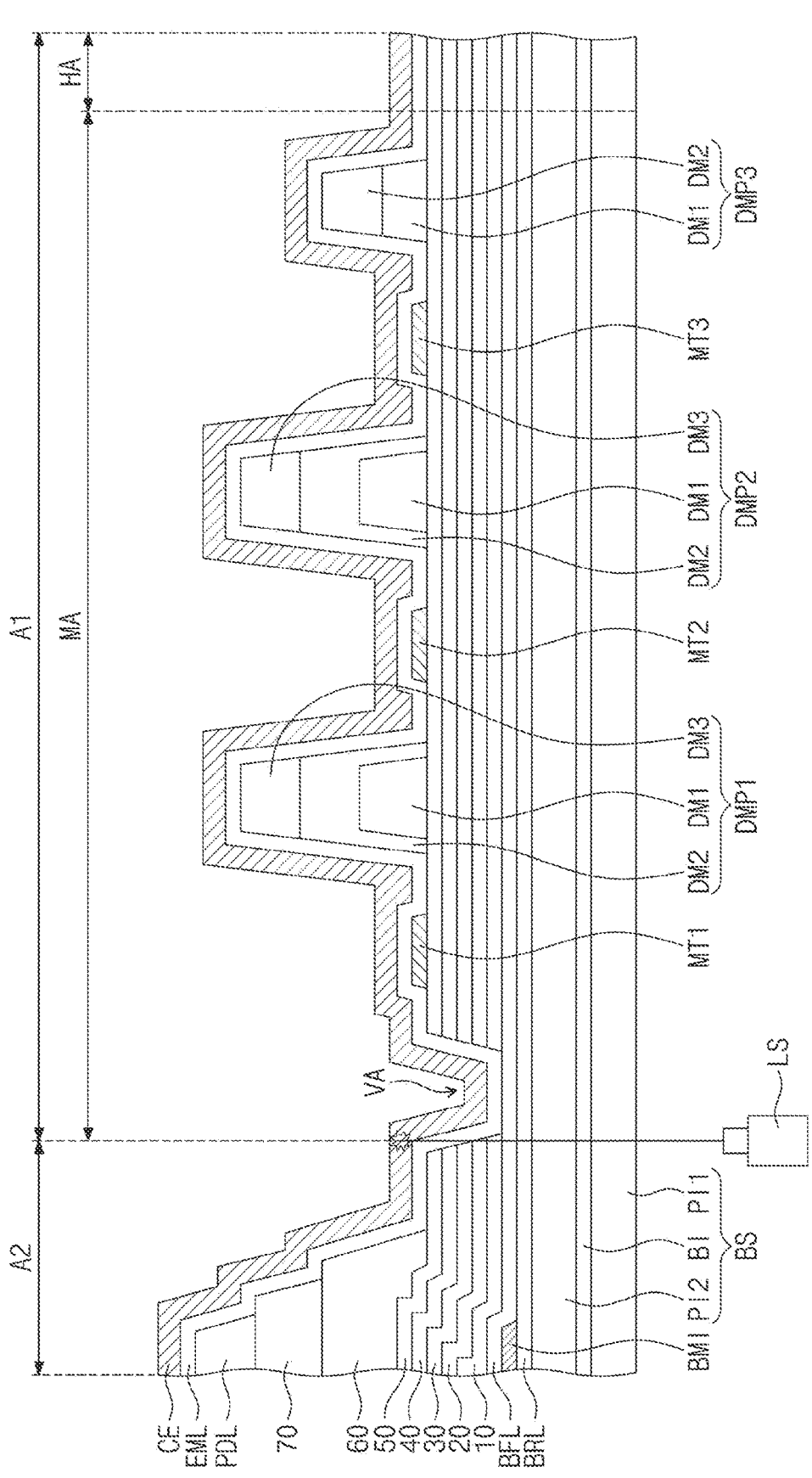
Figure 6I:
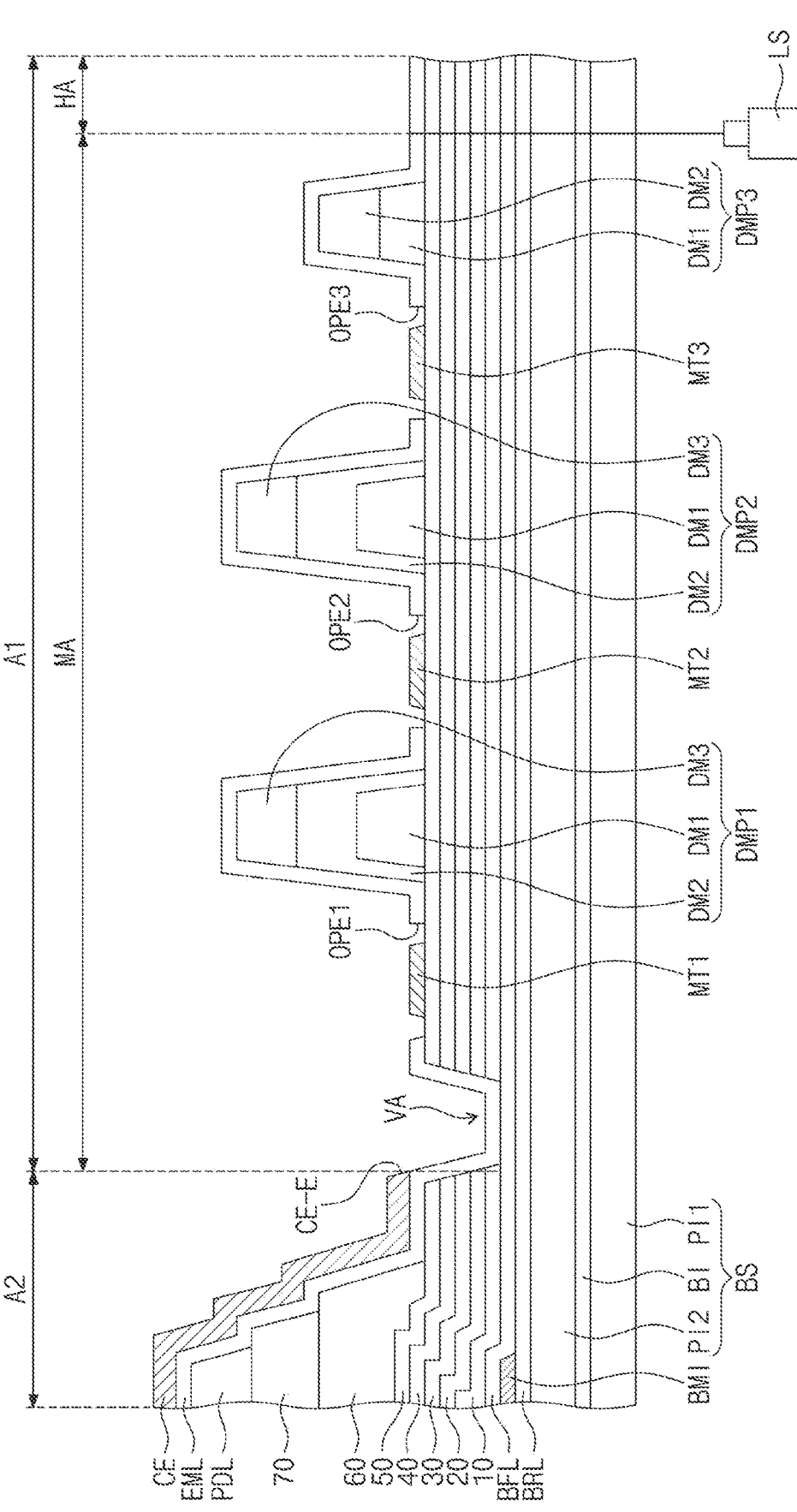

Thereafter, referring to FIGS. 6H and 6I, the method of manufacturing the display module according to some embodiments may include removing the second electrode CE overlapping a margin area MA.

A laser LS may irradiate laser beam in one direction from a second area A2 adjacent to the insulation opening VA, which a starting point at which the laser LS irradiates the laser beam, to the hole area HA. The laser beam irradiated from the laser LS may remove the second electrode CE and may have a wavelength passing the organic layer EML. Accordingly, when the laser beam is irradiated from the margin area MA to the hole area HA, the second electrode CE may be removed from the margin area MA to the hole area HA. The starting point from which the second electrode CE is removed may be defined as an edge CE-E of the second electrode CE, and an electrode opening of the second electrode CE surrounding the hole area HA may be defined as the edge CE-E.

According to some embodiments, when the laser beam is irradiated to the first to third metal patterns MT1, MT2, and MT3, and the organic layer EML located on the first to third metal patterns MT1, MT2, and MT3 may be removed. Accordingly, first to third organic openings OPE1, OPE2, and OPE3 exposing the corresponding to the first to third metal patterns MT1, MT2, and MT3 may be formed in the organic layer EML overlapping the margin area MA.

According to some embodiments, a capping layer covering the second electrode CE may be formed on the second electrode CE. When the laser beam is irradiated to the first to third metal patterns MT1, MT2, and MT3, the capping layer may be removed with the organic layer EML and the second electrode CE.

According to some embodiments, the organic layer EML in a first area A1 may have a disconnected structure in regions overlapping the first to third metal patterns MT1, MT2, and MT3. Accordingly, a path through which moisture and oxygen flowing into the hole MH introduces into the second area A2 through the organic layer EML may be blocked. Therefore, it is possible to provide the method of manufacturing the display module having improved reliability.

According to the method of manufacturing the display module according to some embodiments, when irradiated with the laser beam, a portion of the laser beam irradiated to the tip part Tip formed at the edges of the first to third metal patterns MT1, MT2, and MT3 may be reflected/refracted by the tip part Tip, and thus the laser beam introducing into the first to fifth insulating layers 10, 20, 30, 40 and 50 may be generated. Here, the laser beam incident to the silicon nitride layer located between the silicon oxide layers among the first to fifth insulating layers 10, 20, 30, 40 and 50 may pass through the silicon nitride layer and may be transmitted to the edge CE-E of the second electrode CE.

In this way, the laser beam reflected/refracted and transmitted to the edge CE-E of the second electrode CE may over-process the edge CE-E of the second electrode CE, and thus the edge CE-E of the second electrode CE may be separated from the organic layer EML or may be deformed. In spite of the small number of times of over-processing of the edge CE-E of the second electrode CE, the described problems may occur whenever the laser beam is irradiated to the first to third metal patterns MT1, MT2, and MT3.

FIGS. 7A to 7D are cross-sectional views illustrating a method of manufacturing a display module according to a comparative embodiment. FIGS. 7A to 7D illustrate that the second electrode CE overlapping the margin area MA is removed in a state in which the insulation opening VA is not formed, in a method of manufacturing a display module 100-S according to the comparative embodiment.

When the laser beam of the laser LS is irradiated to the first metal pattern MT1, a first over-processing AC1, in which the portion of the laser beam irradiated to the tip part Tip (refer to FIG. 6F) of the first metal pattern MT1 is irradiated to the edge CE-E of the second electrode CE via a silicon nitride layer among the first to fifth insulating layers 10, 20, 30, 40, and 50, may be performed. Here, the edge CE-E of the second electrode CE may be deformed into a shape different from an initial shape.

When the laser beam of the laser LS is irradiated to the first metal pattern MT1, a second over-processing AC2, in which the portion of the laser beam irradiated to the tip part Tip (refer to FIG. 6F) of the first metal pattern MT1 is irradiated to the edge CE-E of the second electrode CE via the silicon nitride layer among the first to fifth insulating layers 10, 20, 30, 40, and 50, may be performed.

Accordingly, after removing the second electrode CE is completed, the over-processed edge CE-E of the second electrode CE may be separated from the fifth insulating layer 50 or may be deformed.

Again, according to method of manufacturing the display module according to some embodiments, when the laser beam of the laser LS is irradiated to the first to third metal patterns MT1, MT2, and MT3, even when the portion of the laser beam irradiated to the tip part Tip (refer to FIG. 6F) leaks to the first to fifth insulating layers 10, 20, 30, 40, and 50, the first to fifth insulating layers 10, 20, 30, 40, and 50 may include the disconnected insulation opening VA, thereby preventing or reducing overprocessing of the edge CE-E of the second electrode CE.

Accordingly, even when a first inorganic layer 81 of an encapsulation layer 80 is formed after the process of removing the second electrode CE overlapping the margin area MA, the method of manufacturing the display module 100 with improved step-coverage of the encapsulation layer 80 may be provided. Accordingly, the electronic device 1000 (refer to FIG. 1) with improved reliability may be provided.

Figure 6J:
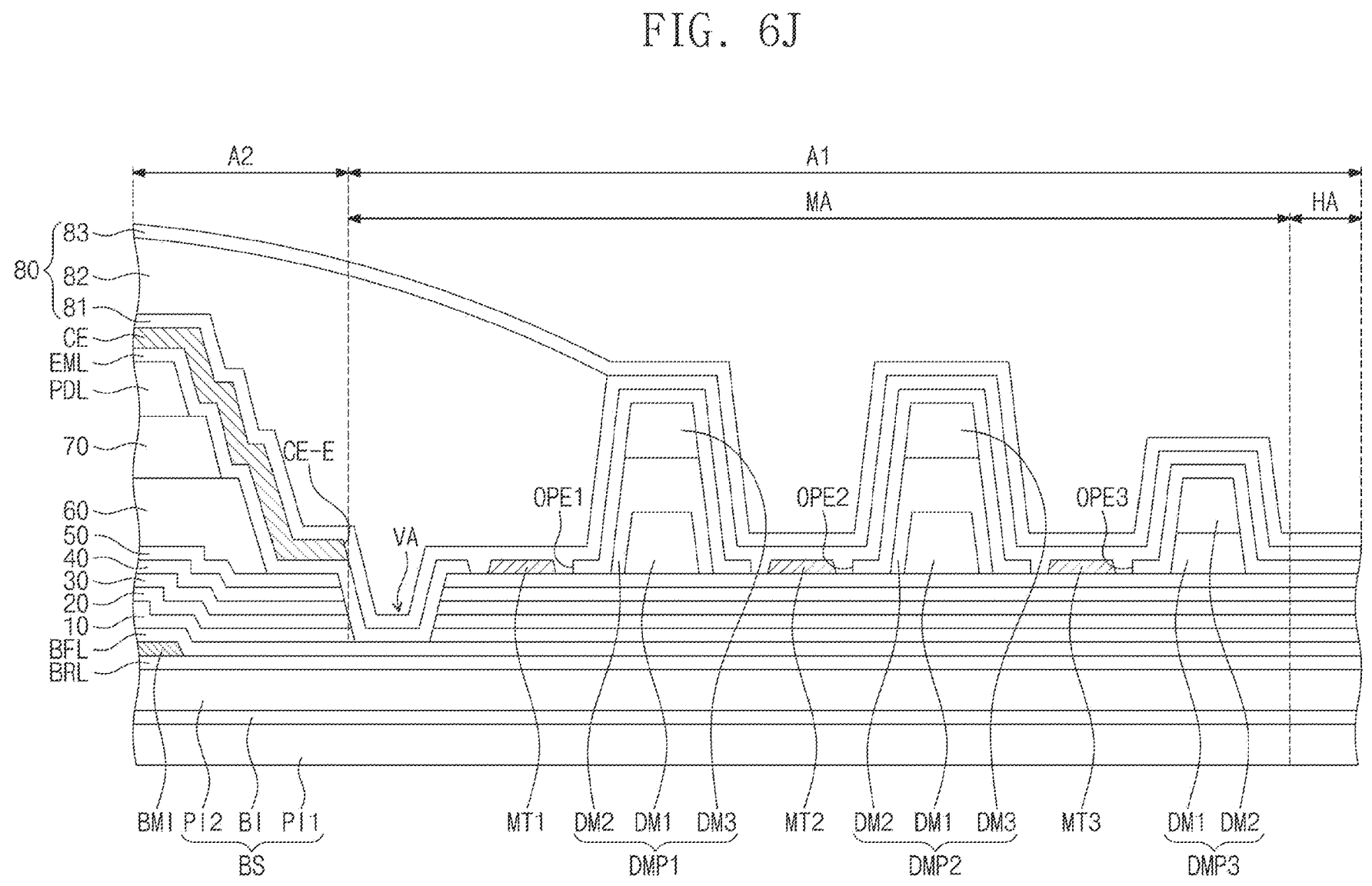
Figure 6K:
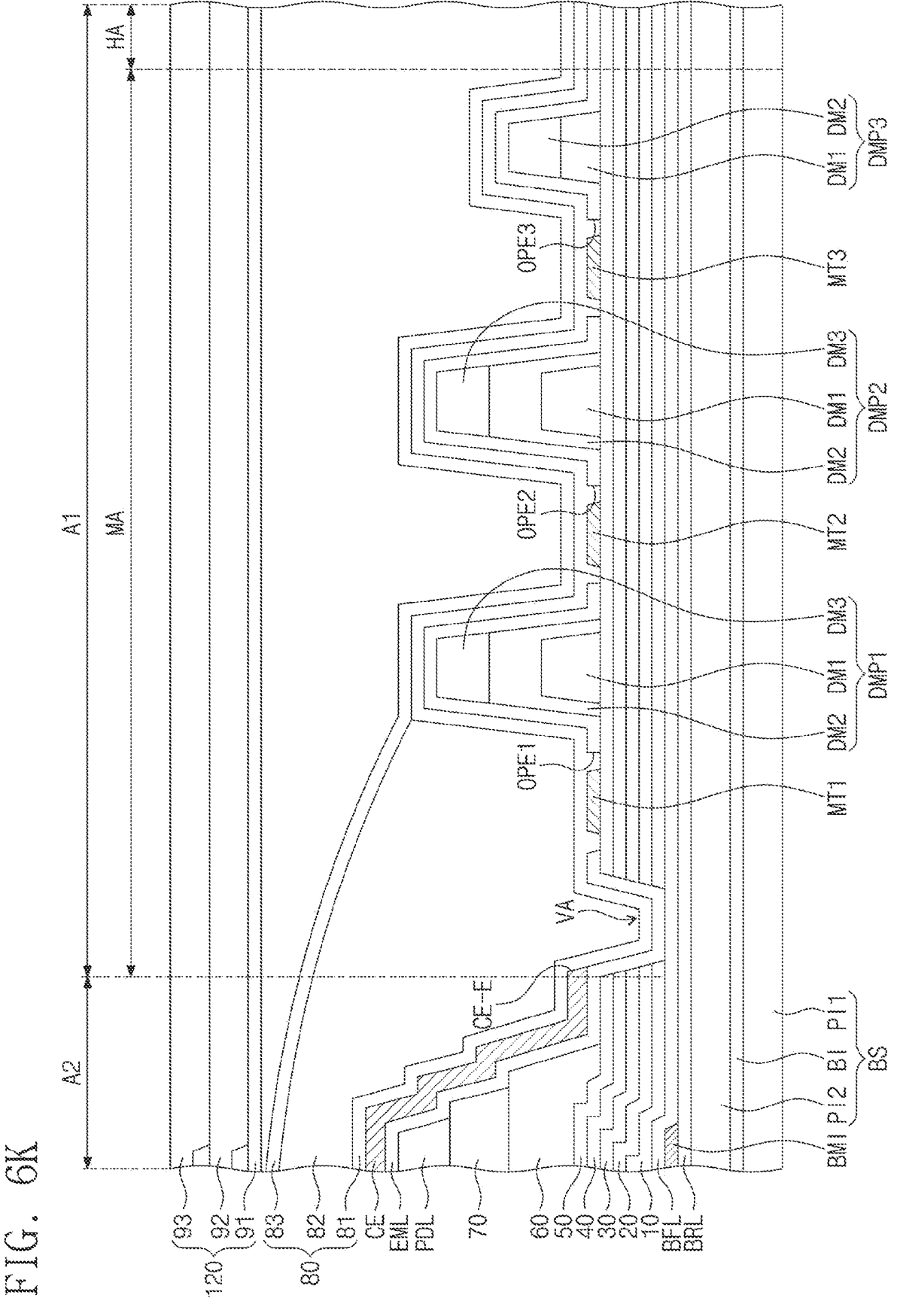

Thereafter, referring to FIGS. 6J and 6K, the method of manufacturing the display module according to some embodiments may include forming an encapsulation layer 80. A first inorganic layer 81 and a second inorganic layer 83 may be formed on the entire first area A1 and the second area A2, and a thin organic layer 82 may be formed up to a first dam part DMP1.

Thereafter, the method may further include forming a planarization layer YOC. The planarization layer YOC may be formed to compensate for a step formed in the first area A1 and the second area A2 due to the thin organic layer 82.

Thereafter, the method may further include forming the input sensor 120 on the encapsulation layer 80 and the planarization layer YOC. The input sensor 120 may be directly formed on the encapsulation layer 80. In the present specification, the meaning of "direct formation" may mean that forming the encapsulation layer 80 and the planarization layer YOC and forming the input sensor 120 are performed continuously.

Figure 6L:
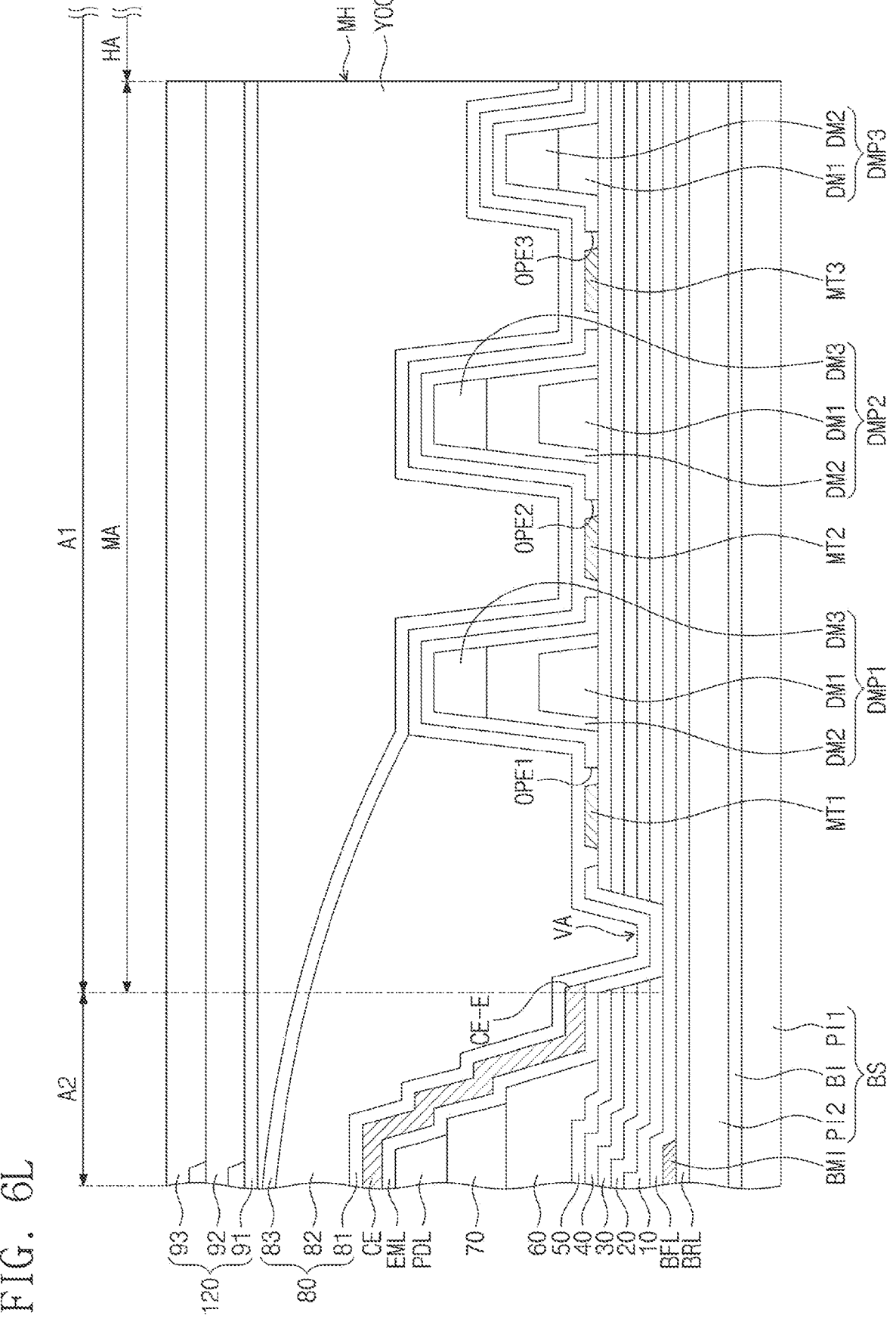
Figure 7A:
FIGS. 7A to 7D are cross-sectional views illustrating a method of manufacturing a display module according to a comparative embodiment.
Figure 7B:
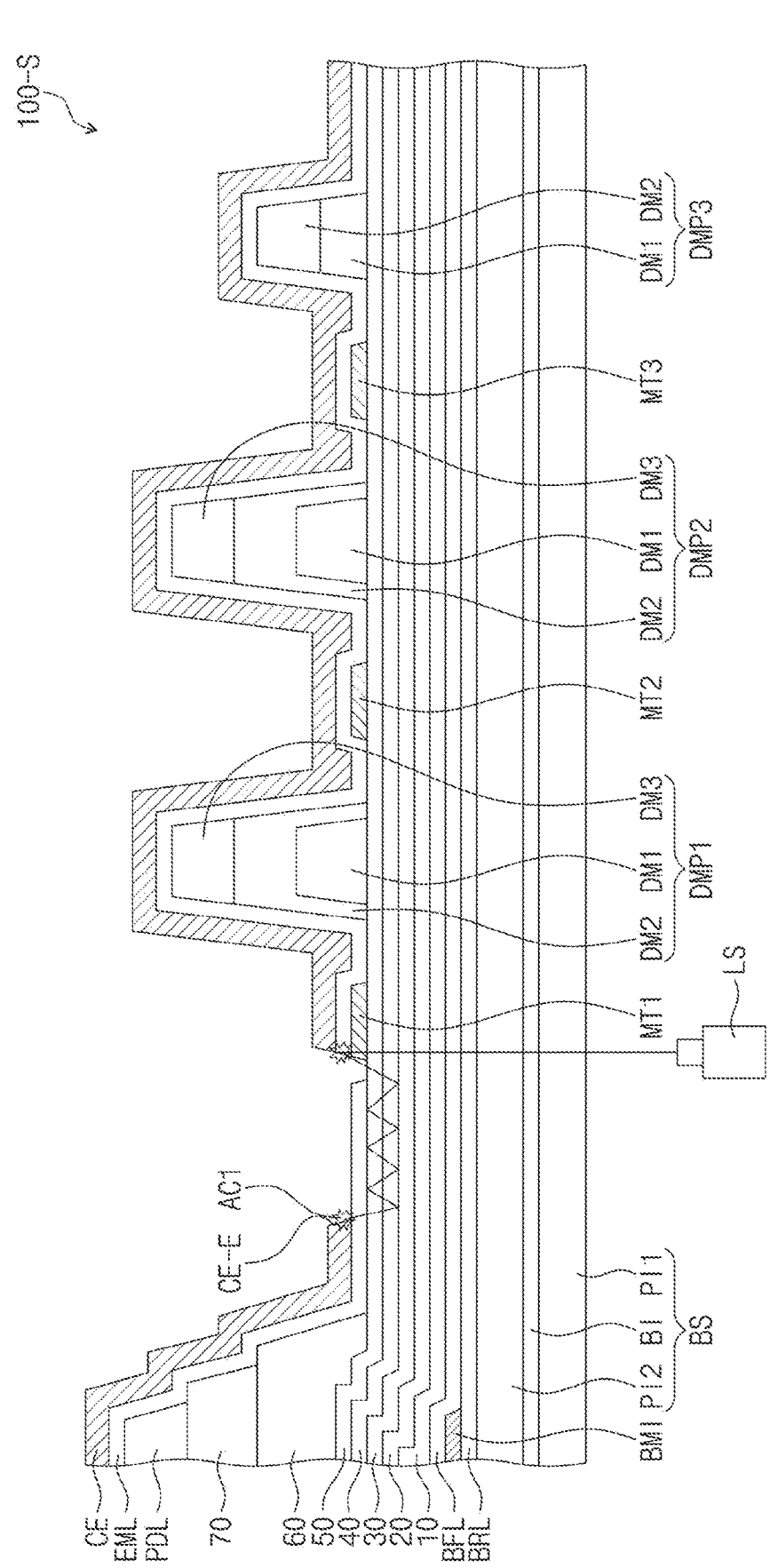
Figure 7C:
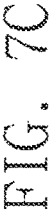
Figure 7D:

Thereafter, referring to FIG. 6L, the method of manufacturing the display module according to some embodiments may include forming a hole MH. The hole MH may be formed by removing components overlapping a hole area HA by irradiating a laser beam.

According to some embodiments, the moisture and oxygen introduced into the hole may be blocked.

In addition, the insulation opening capable of preventing or reducing over-processing of the cathode electrode included in the light emitting device in the region adjacent to the hole, and thus the electronic device with relatively improved reliability may be provided.

While embodiments are described above, a person skilled in the art may understand that many modifications and variations are made without departing from the spirit and scope of embodiments according to the present disclosure defined in the following claims, and their equivalents.

Accordingly, the example embodiments of the inventive concept should be considered in all respects as illustrative and not restrictive, with the spirit and scope of the inventive concept being indicated by the appended claims, and their equivalents.

What is claimed is:

1. An electronic device comprising:
   a display panel including a pixel area configured to display an image, a margin area surrounded by the pixel area, and a hole area surrounded by the margin area, wherein the display panel includes:
   a base layer;
   a circuit element layer including a buffer layer on the base layer, at least one transistor on the buffer layer, at least one insulating layer on the buffer layer, and a first metal pattern on the at least one insulating layer and overlapping the margin area;
   a display element layer including a first electrode connected to the at least one transistor, a second electrode, and an organic layer between the first electrode and the second electrode, wherein an electrode opening corresponding to the margin area is defined by an edge of the second electrode; and
   an encapsulation layer on the display element layer,
   wherein a hole passing through the display panel is defined in the hole area, and
   wherein an insulation opening is overlapped between an edge of the second electrode defined the electrode opening and the first metal pattern in the at least one insulating layer, and exposes a portion of the buffer layer.

2. The electronic device of claim 1, wherein the organic layer covers the portion of the buffer layer exposed by the insulation opening, and
   wherein the second electrode overlaps only the pixel area and is spaced apart from the insulation opening.

3. The electronic device of claim 1, wherein the circuit element layer further includes a first dam part on the at least one insulating layer and overlapped between the first metal pattern and the hole, and
   wherein a first organic opening exposing the first metal pattern is defined in the organic layer, and the organic layer covers the first dam part.

4. The electronic device of claim 3, wherein the encapsulation layer includes a first inorganic layer, a thin organic layer on the first inorganic layer and having a boundary defined by the first dam part, and a second inorganic layer on the thin organic layer, and
   wherein the first inorganic layer covers the first metal pattern.

5. The electronic device of claim 4, wherein the first inorganic layer and the second inorganic layer are in contact with each other from a top surface of the first dam part to the hole area.

6. The electronic device of claim 4, wherein the circuit element layer further includes a second dam part overlapping the margin area and adjacent to the hole than the first dam part, and a second metal pattern between the first dam part and the second dam part, and
   wherein a second organic opening exposing the second metal pattern is in the organic layer, and the organic layer covers the second dam part.

7. The electronic device of claim 6, wherein the circuit element layer further includes a third dam part overlapping the margin area and adjacent to the hole than the second dam part, and a third metal pattern between the second dam part and the third dam part, and
   wherein a third organic opening exposing the third metal pattern is in the organic layer, and the organic layer covers the third dam part.

8. The electronic device of claim 7, wherein a thickness of the third dam part is smaller than a thickness of the first dam part and a thickness of the second dam part.

9. The electronic device of claim 1, wherein the at least one transistor includes a first transistor including a first active pattern, a first control electrode overlapping the first active pattern, and an upper electrode overlapping the first control electrode, and a second transistor including a second active pattern and a second control electrode overlapping the second active pattern.

10. The electronic device of claim 9, wherein the circuit element layer includes:

a first insulating layer on the buffer layer and covering the first active pattern;

a second insulating layer on the first insulating layer and covering the first control electrode;

a third insulating layer on second insulating layer and covering the upper electrode;

a fourth insulating layer on the third insulating layer and covering the second active pattern;

a fifth insulating layer on the fourth insulating layer and covering the second control electrode;

a sixth insulating layer on the fifth insulating layer; and a seventh insulating layer on the sixth insulating layer, wherein the at least one insulating layer includes at least one of the first to the fifth insulating layers.

11. The electronic device of claim 10, wherein the first insulating layer and the fourth insulating layer include a single layer of silicon oxide, wherein the second insulating layer includes a single layer of silicon nitride, and wherein the third insulating layer and the fifth insulating layer includes sequentially stacked silicon nitride and silicon oxide.

12. The electronic device of claim 10, wherein the first to fifth insulating layers are in contact with each other in the margin area except for the insulation opening.

13. The electronic device of claim 10, wherein the circuit element layer further includes a first connection electrode on the fifth insulating layer and connected to the first active pattern through a first contact hole defined in the first to fifth insulating layers, and a second connection electrode on the sixth insulating layer and connected to the first connection electrode through a contact hole defined in the sixth insulating layer, and wherein each of the first connection electrode and the second connection electrode includes a lower layer, a middle layer, and an upper layer sequentially stacked.

14. The electronic device of claim 13, wherein the first metal pattern includes a same material as the lower layer of the first connection electrode.

15. The electronic device of claim 14, wherein the lower layer and the upper layer include titanium, and the middle layer includes aluminum.

16. The electronic device of claim 1, further comprising a planarization layer on the encapsulation layer and surrounding the hole area.

17. The electronic device of claim 16, further comprising an input sensor on the encapsulation layer and the planarization layer, and spaced apart from the hole area.

18. The electronic device of claim 1, wherein the base layer includes a first base layer including an organic material, a cover layer on the first base layer and including an inorganic material, and a second base layer on the cover layer and including an organic material, and wherein the circuit element layer further includes a barrier layer between the second base layer and the buffer layer.

19. The electronic device of claim 18, the circuit element layer further includes a light blocking pattern on the barrier layer, covered by the buffer layer, and overlapping the at least one transistor.

20. The electronic device of claim 1, further comprising an electronic module overlapping the hole, wherein the electronic module includes at least one of a light emitting module, a light receiving module, or a camera module.

\* \* \* \* \*